United States Patent
Tachimori

(10) Patent No.: US 6,954,511 B2
(45) Date of Patent: Oct. 11, 2005

(54) PHASE-LOCKED LOOP CIRCUIT AND DELAY-LOCKED LOOP CIRCUIT

(75) Inventor: Hiroshi Tachimori, Tokyo (JP)

(73) Assignee: Sony Corporation (JP)

( * ) Notice: Subject to any disclaimer, the term of this patent is extended or adjusted under 35 U.S.C. 154(b) by 751 days.

(21) Appl. No.: 09/955,071

(22) Filed: Sep. 19, 2001

(65) Prior Publication Data

US 2002/0051508 A1 May 2, 2002

(30) Foreign Application Priority Data

Sep. 21, 2000 (JP) .................................. P2000-287003

(51) Int. Cl.$^7$ ............................................. H04L 0/033
(52) U.S. Cl. ...................................... 375/376; 331/16
(58) Field of Search ............................... 375/376, 373, 375/374, 340; 331/16

(56) References Cited

U.S. PATENT DOCUMENTS

| | | | |
|---|---|---|---|
| 4,156,855 A | * 5/1979 | Crowley | ................ 331/1 A |
| 5,334,954 A | * 8/1994 | Koblitz et al. | ........... 331/20 |
| 5,831,483 A | * 11/1998 | Fukuda | ................... 331/17 |
| 5,896,066 A | * 4/1999 | Katayama et al. | ....... 331/17 |

FOREIGN PATENT DOCUMENTS

| | | |
|---|---|---|
| EP | 312141 | 4/1989 |
| EP | 373750 | 6/1990 |
| EP | 833452 | 4/1998 |
| JP | 10-242851 | 9/1998 |
| JP | 11-027106 | 1/1999 |
| JP | 11-195982 | 7/1999 |

* cited by examiner

Primary Examiner—Stephen Chin
Assistant Examiner—Jaison Joseph
(74) Attorney, Agent, or Firm—Rader, Fishman & Grauer PLLC; Ronald P. Kananen

(57) ABSTRACT

A PLL circuit and a DLL circuit able to stabilize a control voltage within a short time after a phase pull-in operation in each cycle of a reference clock. In a phase comparator, the size of a leading phase or a delayed phase of a feedback signal is detected with respect to a reference clock signa, and pulse signals having pulse widths corresponding to the size are output. A current corresponding to the signals is output from a charge pump circuit to a lag-lead filter, and a control voltage obtained by removing noise of the above output is output from a low-pass filter to a voltage-controlled oscillator. Furthermore, through capacitors, pulse signals are superposed on the control voltage, and a sharp waveform is obtained by correcting blunting of the waveform by the low-pass filter. Due to this, the control voltage is stabilized within a short time after a phase pull-in operation in each cycle of the reference clock signal.

46 Claims, 16 Drawing Sheets

PRIOR ART

PHASE-LOCKED LOOP CIRCUIT AND DELAY-LOCKED LOOP CIRCUIT

BACKGROUND OF THE INVENTION

1. Field of the Invention

The present invention relates to a phase-locked loop circuit and a delay-locked loop circuit, for example, and relates to a phase-locked loop circuit and a delay-locked loop circuit in a digital television set for generating dot clocks.

2. Description of the Related Art

For displaying a video signal on a display of a personal computer or for displaying OSD (on screen display) text on a television monitor, use is made of dot clocks obtained by multiplication by a PLL (phase-locked loop) circuit using the horizontal synchronization signal HSYNC as a reference clock signal. If the jitter of the PLL circuit is large, flicker or waving will appear on the screen and will end up being caught visually, so a PLL circuit having low jitter is considered necessary for a dot clock generating circuit.

A change of voltage conditions slower than the reference clock signal or the natural frequency of a PLL circuit is corrected by the feedback loop of the PLL circuit itself. However, digital noise generated in shorter periods than that of the reference clock signal can be considered as random components in each cycle of the reference clock signal and cannot be corrected sufficiently by the feedback loop, thus causing jitter after the PLL is locked.

For random jitter occurring after the PLL is locked and seldom lasting long, rather than causing a change of the frequency mainly by frequency pull-in through charging or discharging a capacitor of a loop filter, it is effective to correct the phase of jitter portion in each cycle mainly by phase pull-in performed in each cycle of the reference clock signal. However, since the change of the voltage of the pulse signal input to a VCO circuit cannot be made too large during phase pull-in, it is difficult to design the circuit to correct exactly 100% of the jitter by the phase pull-in alone. Therefore, it is thought optimal to use the method of digitally correcting the phase of jitter when generating dot clocks together with phase correction by phase pull-in of a PLL circuit. For example, the phase of the jitter is corrected by selecting the clock rising earliest from a trailing edge (the left end of the screen) of the horizontal synchronization signal HSYNC from a plurality of clocks different in phase and using this clock to generate dot clocks.

When correcting the phase mainly by phase pull-in, a lag-lead filter is suitable for the loop filter in a PLL circuit or a DLL (delay-locked loop). A lag-lead filter is for example a filter comprised of a series circuit of a resistor and capacitor and has a phase property of a phase delayed at a low band being restored at a high band.

When using a lag-lead filter as a loop filter, a control voltage is generated having a combined waveform of a rectangular waveform corresponding to pulse signals output by a phase comparator (up signal and down signal) and a flat waveform along a time axis generated by the charging and discharging of a capacitor by a charge pump circuit. In the rectangular waveform, phase pull-in is mainly performed, while in the flat waveform along the time axis, frequency pull-in together with indirect phase pull-in is performed. Due to this, a larger phase pull-in can be obtained compared with the case of using a lag filter in which the waveform is blunted at the high band, so the output current of the charge pump can be designed to be small and the change of a control voltage due to charging and discharging of the capacitor of a loop filter becomes small. As a result, the change of the control voltage after phase pull-in due to a control voltage having a rectangular waveform can be made smaller, and the jitter of frequency can be made smaller.

In addition, by comparing phases at the rising edge (the right end of a screen) of a horizontal synchronization signal HSYNC, since the charge pump circuit is operating in the blanking period, the large change of the clock phase that occurs when using a lag-lead filter does not affect the display on the screen. Furthermore, after the operation of the charge pump circuit is finished and the control voltage becomes sufficiently stable, by digitally correcting the phase of the jitter and generating dot clocks at a trailing edge (the left end of a screen) of the horizontal synchronization signal HSYNC, a picture having little flicker and waving can be obtained.

However, when a low-pass filter is provided after the lag-lead filter to reduce the influence of noise or when a capacitor is provided to stabilize the control voltage between an output of a bias circuit and a ground line or a power line, the rectangular waveform of the control voltage of a voltage controlled oscillator or a voltage controlled delay circuit ends up being blunted. Due to this, the change of the control voltage does not end even after the trailing edge (the left end of the screen) of the horizontal synchronization signal HSYNC, so the phase ends up changing. Therefore, there is a disadvantage that the effect of digital phase correction ends up declining at the trailing edge of the horizontal synchronization signal HSYNC, and the merit of using a lag-lead filter is lost.

Below, a detailed explanation will be made of the above problem in a PLL circuit of the prior art using a lag-lead filter.

FIG. 11 is a view of the configuration of a first mode of a PLL circuit of the prior art using a lag-lead filter.

The PLL circuit shown in FIG. 11 includes a phase comparator 101, a charge pump circuit 102, a lag-lead filter 103, a low-pass filter 104, a voltage-controlled oscillator 105, and a frequency divider 106.

The phase comparator 101 compares phases of a reference signal φREF and an output signal NOUT of the frequency divider 106 and outputs an up signal /UP or a down signal DOWN corresponding to the result of comparison.

The charge pump circuit 102 receives the up signal /UP or down signal DOWN from the phase comparator 101 and outputs a charging and discharging current ICP to the lag-lead filter 3.

The lag-lead filter 103, for example, is comprised of a resistor RF1 and a capacitor CF1 connected in series between the output of the charge pump circuit 102 and the ground line. It receives the charging and discharging current ICP and outputs the generated voltage FIL of the series circuit to the low-pass filter 104.

The low-pass filter 104, for example, is comprised of a resistor RLP and a capacitor CLP connected in series between the output of the charge pump circuit 102 and the ground line. It receives the voltage FIL of the lag-lead filter 103 and outputs a voltage LPO of the capacitor CLP corresponding to the voltage FIL to the voltage-controlled oscillator 105.

The voltage-controlled oscillator 105 receives the output voltage LPO of the low-pass filter 104 and outputs a signal φVCO having a frequency corresponding to it.

The frequency divider 106 divides the output signal φVCO of the voltage-controlled oscillator 105 by a certain division ratio and outputs a signal NOUT to the phase comparator 101.

If the reference clock signal φREF is of a low frequency, for example, the horizontal synchronization signal HSYNC of 12 kHz or so, it becomes difficult to include the capacitor CF1 of the lag-lead filter 103 in a semiconductor chip, so it is preferable to make it an external part.

The grounding point of the voltage-controlled oscillator 105 included in a semiconductor chip and the grounding point of the external capacitor CF1 of the lag-lead filter 103 are different, so if the voltage FIL of the lag-lead filter 103 is directly used as a control voltage of the voltage-controlled oscillator 105, the potential difference of the two grounding points becomes noise superposed onto the control voltage when viewed from the voltage-controlled oscillator 105, whereby the jitter of the PLL circuit ends up being increased. Because of this, preferably a low-pass filter 104 built in the semiconductor chip is provided between the lag-lead filter 103 and the voltage-controlled oscillator 105. Since the grounding point of the capacitor CLP and the grounding point of the voltage-controlled oscillator 105 are from the same place, the aforesaid noise due to the potential difference of the two grounding points is reduced.

In the noise of the control voltage due to the potential difference between the grounding point of the external capacitor CF1 and the grounding point of the voltage-controlled oscillator 105, the noise voltage ΔVNOISE_LP output from the low-pass filter 104 is expressed as follows from the amplitude ΔVNOISE of the noise in the input of the low-pass filter 104, the time width $\sqrt[4]{}$ NOISE of the noise, the frequency fNOISE of the noise, the shielding frequency fLP1 of the low-pass filter 104, and the time constant τLP1:

$$\Delta VNOISE\_LP \approx \Delta VNOISE / (fNOISE / fLP1) \quad (1)$$
$$\approx \Delta VNOISE \times (\tau NOISE / \tau LP1)$$

For example, if the noise voltage ΔVNOISE is 10 mV, the time constant τNOISE is 2.8 nsec, and the time constant τLP1 is 280 nsec, the noise voltage ΔVNOISE_LP is about 100 μV.

FIGS. 12A to 12F give waveform diagrams for explaining the operation of the first mode of the PLL circuit of the prior art.

Waveform diagram of FIG. 12A shows the waveform of the reference clock signal φREF.

Waveform diagram of FIG. 12B shows the waveform of the output signal NOUT of the frequency divider 106.

Waveform diagram of FIG. 12C shows the waveform of the signal /UP of the phase comparator 101.

Waveform diagram of FIG. 12D shows the waveform of the signal DOWN of the phase comparator 101.

Waveform diagram of FIG. 12E shows the waveform of the output voltage FIL of the lag-lead filter 103.

Waveform diagram of FIG. 12F shows the waveform of the output voltage LPO of the low-pass filter 104.

The phase comparator 101 compares the timing of the rising edge of the reference clock signal φREF and the trailing edge of the output signal NOUT of the frequency divider 106. If the trailing edge of the signal NOUT is late relative to the rising edge of the reference clock signal φREF, a low level pulse signal, that is, the up signal /UP, is output. If the trailing edge of the signal NOUT is earlier, a high level pulse signal, that is, the down signal DOWN, is output.

The up signal /UP, for example, is input to the gate of a p-channel MOS transistor on the not shown power source line side of the charge pump circuit 102. By inputting a low level pulse signal to the up signal /UP, the p-channel MOS transistor is turned on, and the charging current ICP is supplied to the lag-lead filter 103.

In addition, the down signal DOWN, for example, is input to the gate of a n-channel MOS transistor on a not shown ground line side of the charge pump circuit 102. By inputting a high level pulse signal to the down signal DOWN, the n-channel MOS transistor is turned on, and the discharging current ICP is supplied to the lag-lead filter 103.

Due to the charging and discharging current ICP output from the charge pump circuit 102, the output voltage FIL of the lag-lead filter 103 and the output signal LPO of the low-pass filter 104 change. Due to this, the oscillation frequency of the voltage-controlled oscillator 105 increases or decreases.

In the period Δt when the up signal /UP or the down signal DOWN is generated, the output current ICP from the charge pump circuit 102 passes through the resistor RF1 of the lag-lead filter 103 and the resistor RLP of the low-pass filter 104 and charges or discharges the capacitor CF1 of the lag-lead filter 103 and the capacitor CLP of the low-pass filter 104. The output voltage FIL of the lag-lead filter 103 has a combined waveform of a rectangular voltage waveform S1LFIL generated by conducting the current ICP through the parallel resistance of the resistor RF1 and the resistor RLP and a flat waveform along the time axis generated by charging and discharging the parallel capacitance of the capacitor CF1 and the capacitor CLP and retaining the charge.

In the output voltage FIL of the lag-lead filter 103, if the resistor RF1 is sufficiently small compared with the resistor RLP and the capacitor CF1 is sufficiently large compared with the capacitor CLP, the voltage change ΔV1FIL of the voltage waveform S1FIL and the voltage change ΔV2FIL of the voltage waveform S2FIL are expressed as follows:

$$\Delta V1FIL = ICP / \{(1/RF1) + (1/RLP)\} \quad (2)$$
$$\approx ICP \times RF1$$

$$\Delta V2FIL = (ICP \times \Delta t) / (CF1 + CLP) \quad (3)$$
$$\approx (ICP \times \Delta t) / CF1$$

Therefore, the output voltage FIL of the lag-lead filter 103 appears with almost the same waveform as that when there is no low-pass filter 104.

In addition, the area ZS1FIL of the voltage waveform S1LFIL and the area ZS2FIL of the voltage waveform S2FIL are expressed as follows:

$$ZS1FIL = \Delta V1FIL \times \Delta t \quad (4)$$

$$ZS2FIL = \Delta V2FIL \times T \quad (5)$$

Here, the sum of the area ZS1FIL and the area ZS2FIL (ZS1FIL+ZS2FIL) is related to the phase pull-in, and the area ZS2FIL is proportional to the voltage variation ΔV2FIL, so is related to the frequency change (pull-in). For example, if the frequency change is designed to be a half of the phase pull-in, the area ZS1FIL and the area ZS2FIL are substantially equal, so the following equation holds:

$$\Delta V2FIL \approx \Delta V1FIL \times (\Delta t / T) \quad (6)$$

Since the time Δt is shorter than the period T, the voltage ΔV2FIL becomes smaller than the voltage ΔV1FIL.

The output voltage LPO of the low-pass filter 104 appears as a blunted waveform of the output voltage FIL of the lag-lead filter 103, but by treating the voltage waveform S1FIL and the voltage waveform S2FIL in the same way, the output voltage LPO can be separated into a voltage waveform S1LP corresponding to the rectangular voltage waveform S1FIL and a voltage waveform S2LP corresponding to the flat voltage waveform S2FIL for consideration.

The voltage waveform S1FIL has a blunted rising edge waveform changing exponentially by a time constant of the low-pass filter 104. The voltage $\Delta V1LPO$ rising exponentially from the voltage 0 to the voltage AV1FIL can be approximated by the following equation:

$$\Delta V1LPO(t) = \Delta V1FIL \times \{1 - \exp(-t/\tau LP1)\} \quad (7)$$
$$\approx \Delta V1FIL \times (t/\tau LP1)\}$$
where, $\tau LP1 = CLP \times RLP$ Therefore, if the time $\Delta t$ is sufficiently shorter than the time constant $\tau LP1$ of the low-pass filter 104, the peak voltage $\Delta V1LPO$ is expressed by the following equation:

$$\Delta V1LPO \approx \Delta V1FIL \times (\Delta t/\tau LP1) \quad (8)$$

On the other hand, the falling waveform of the voltage waveform S1LP which falls exponentially from the peak voltage $\Delta V1LPO$ to the voltage $\Delta V2FIL$ can be approximated by the following equation:

$$\Delta V1LPO(t) = (\Delta V1LPO - \Delta V2FIL) \times \exp(-t/\tau LP2) + \Delta V2FIL \quad (9)$$
$$\approx \Delta V1LPO \times \exp(-t/\tau LP2)$$
where, $T1p2 \approx CLP \times (RLP + RF1)$.

In addition, at the trailing edge of the reference clock signal $\phi REF$, namely, the time $t = \alpha T$ ($\alpha \approx 1/10$), the voltage after the blunted voltage waveform S1LP has exponentially attenuated can be expressed by the following equation:

$$\Delta V1LPO(\alpha T) \approx \Delta V1LPO \times \exp(-\alpha T/\tau LP2) \quad (10)$$
$$\approx \Delta V1FIL \times (\Delta t/\tau LP1) \times \exp(-\alpha T/\tau LP2)$$

For displaying pictures or texts, at the trailing edge of the reference clock signal $\phi REF$, namely, at the left end of the screen, the voltage waveform S1LP must be sufficiently attenuated. Therefore, it is a criterion of design that the following equation be satisfied:

$$\Delta V1LPO(\alpha T) \leq \Delta V2FIL \quad (11)$$

Entering equation (10) and equation (6) into equation (11) to modify it, the following equation is obtained:

$$T/\tau LP1 \leq \exp(\alpha t/\tau LP2) \quad (12)$$

From equation (12), if $\alpha = 1/10$, the next equation holds:

$$\tau LP1 \approx \tau LP2 \leq 35.8 \quad (13)$$

For example,
if T=64 μsec, τLP1≦1.8 μsec
if T=10 μsec, τLP1≦280 nsec
From equation (1), in order to make the value of the noise voltage $\Delta VNOISE\_LP$ small, it is necessary to increase the value of the time constant $\tau LP1$ to some extent. In this case, however, it becomes difficult to satisfy equation (11).

That is, if the time constant τLP1 of the low-pass filter 104 is increased to reduce the influence of the noise, the control voltage continues changing even after the trailing edge of the reference clock signal $\phi REF$, so there arises a problem that the effect of the phase correction performed at the trailing edge of the reference clock signal $\phi REF$ ends up being reduced.

Note that if the time constant τLP1 is sufficiently smaller than the period T, the area of the blunted voltage waveform S1LP is roughly given by the following equation:

$$S_{1LP} \approx \frac{\Delta V_{1LPO} \times \Delta t}{2} + \Delta V_{1LPO} \int_{t=0}^{t=T} \exp(-t/\tau LP2) dt \quad (14)$$
$$\approx ICP \times RF1 \times \Delta t$$

From the above equation, it is clear that the area of the blunted voltage waveform S1LP coincides with the area of the rectangular lead pulse of the lag-lead filter when there is no low-pass filter 104.

Next, an explanation will be made of a second mode of the PLL circuit of the prior art using a lag-lead filter.

FIG. 13 is a view of the configuration of the second mode of a PLL circuit of the prior art using a lag-lead filter.

The same reference numerals in FIG. 11 and FIG. 13 indicate the same constituent elements. In addition, the PLL circuit shown in FIG. 13 includes a bias circuit 107, a capacitor GPB, and a capacitor CNB.

The difference of the second mode relative to the first mode lies in the point that a bias circuit 107 is incorporated instead of a low-pass filter 104 between the lag-lead filter 103 and the voltage-controlled oscillator 105.

The bias circuit 107 receives the output voltage FIL of the lag-lead filter 103, generates a bias voltage NBIAS and a bias voltage PBIAS, and outputs them to the voltage-controlled oscillator 105. The bias circuit, for example, is comprised of a combination of current mirror circuits.

Here, the bias circuit 107 and the voltage-controlled oscillator 105 will be explained.

FIG. 15 is a view of an example of a circuit of a voltage-controlled oscillator.

The voltage-controlled oscillator shown in FIG. 15 comprises delay blocks 51-1 to 51-n and an NAND circuit 56.

In addition, each of the delay blocks 51-1 to 51-n has a two-stage inverter type delay stage comprised of a pMOS transistor Qp50, a pMOS transistor Qp51, a nMOS transistor Qn50, and a nMOS transistor Qn51 and has an output buffer BUF.

The pMOS transistor Qp51 and the nMOS transistor Qn50 receive as input a signal from the earlier stage at their mutually connected gates and output a signal to the next stage from their mutually connected drains. The source of the pMOS transistor Qp51 is connected to the power line Vdd through the drain and source of the pMOS transistor Qp50, while the source of the nMOS transistor Qn50 is connected to the ground line through the drain and source of the nMOS transistor Qn51. A bias voltage PBIAS is applied to the gate of the pMOS transistor Qp50, while a bias voltage NBIAS is applied to the gate of the nMOS transistor Qp51.

In each delay block, two inverter type stages are connected in cascade. A buffer BUF is inserted at the output of the delay block.

As shown in the circuit example of FIG. 15, each delay block included in the voltage-controlled oscillator 105, for example, comprises two inverter type delay stages each provided with a current source transistor (the PMOS transistor Qp50) on the power line side controlled by the bias voltage PBIAS and a current source transistor (the nMOS transistor Qp51) on the ground line side controlled by the bias voltage NBIAS and one inverter (output buffer BUF) for use as a buffer.

If the signal PWON is set at a high level, the gate of the NAND circuit 56 is turned ON, a signal from the last stage of the delay blocks connected in cascade is fed back to the first stage, and oscillation starts. At this time, clock signals $\phi\{0\}$ to $\phi\{\pi\}$ are output from the delay blocks.

FIG. 16 is a circuit diagram showing an example of a bias circuit.

The bias circuit shown in FIG. 16 comprises a pMOS transistor Qp101, a pMOS transistor Qp102, an nMOS transistor Qn101, and an nMOS transistor Qn102.

The nMOS transistor Qn101 receives a voltage FIL at its gate, is connected to the ground line at its source, and is connected to the drain of the pMOS transistor Qp101 at its drain.

The pMOS transistor Qp101 is connected to the power line Vdd at its source, is connected to its own drain at its gate, and outputs the bias voltage PBIAS from its gate.

The nMOS transistor Qn102 receives the bias voltage PBIAS at its gate, is connected to the power line Vdd at its source, and is connected to the drain of the nMOS transistor Qn102 at its drain.

The nMOS transistor Qn102 is connected to the ground line Vdd at its source, is connected to its own drain at its gate, and outputs the bias voltage NBIAS from its gate.

The current mirror type bias circuit shown in FIG. 16, for example, generates a bias voltage PBIAS by the first current mirror circuit (the nMOS transistor Qn101 and the pMOS transistor Qp101) to which the voltage FIL is input and furthermore generates a bias voltage NBIAS by the second current mirror circuit (the pMOS transistor Qp102 and the nMOS transistor Qn102) to which the bias voltage PBIAS is input.

By supplying the voltage-controlled oscillator 105 with the bias voltages generated by the bias circuit shown in FIG. 16, even if the output voltage FIL of the lag-lead filter 103 changes, the current flowing to the current source transistor of the power line side (the PMOS transistor Qp50) controlled according to the bias voltage PBIAS and the current flowing to the current source transistor of the ground line side (the nMOS transistor Qn51) controlled according to the bias voltage NBIAS are controlled to generally balance out. In addition, under standard conditions, the delay time of each inverter type delay stage at the rising edge of output and the delay time at the trailing edge of output change in the same way to balance each other even if the voltage FIL changes somewhat. Furthermore, for the inverter for buffer use, the ratio of sizes of the pMOS and nMOS transistors is decided in order to balance the delay time at the rising edge and the delay time at the trailing edge. Consequently, the fluctuation of the duty of clock signals output from the voltage-controlled oscillator 105 caused by a change of the voltage FIL, variability in the processes, and a change of the power voltage can be prevented.

However, when a large consumed power is injected into the above bias circuit 107, the overall power consumption of the PLL circuit ends up being increasingly increased, so usually the power consumption of the bias circuit 107 has to be kept lower than the power consumption of the voltage-controlled oscillator 105. Due to this, the values of the output impedance RNBO and RPBO of the bias circuit 107 need be relatively large.

On the other hand, when the voltage-controlled oscillator is in operation, changes of the output voltages of all delay stages are propagated via the gate capacitance of the current power transistors or the branch transistors included in the delay stages into which the bias voltage NBIAS and the bias voltage PBIAS are input. As a result, when the output impedance RNBO and output impedance RPBO of the bias circuit are relatively large in value, the characteristic of the oscillation frequency vs. control voltage of the voltage-controlled oscillator ends up deviating and the output of the bias circuit ends up losing out to the noise in some cases (see Japanese Unexamined Patent Publication (Kokai) No. 11-27106, "Voltage-Controlled Oscillation Circuit".)

In order to prevent such a problem without increasing the power consumption, as shown in FIG. 13, the practice has been to provide a capacitor CNP or capacitor CPB between the output of the bias circuit 107 and the power line or the ground line to stabilize the bias voltage NBIAS or the bias voltage PBIAS.

Assuming that the voltage under the gate of the current source transistor changes due to the drain voltage of the current source transistor changing up to an intermediate voltage, namely, changing by exactly the power voltage Vdd/2, when the delay stages are operating, when no capacitor for stabilization is provided, the oscillation voltage $\Delta VOSC$ superposed on the gate voltage can be expressed by the following equation from the gate capacitance Cg of the current source transistors included in the delay stages of the voltage-controlled oscillator 105 and the number N of the delay stages:

$$\Delta VOSC \approx \{(Cg/2)/(N \times Cg)\} \times (Vdd/2) \qquad (15)$$

$$\approx Vdd/4N$$

For example, if the power voltage Vdd is 3.3V and the number N of the delay stages is 17, the oscillation voltage $\Delta VOSC$ superposed on the gate voltage becomes about 50 mV. This value is roughly three orders of magnitude larger than the accuracy required by the control voltage of the voltage-controlled oscillator 105.

In addition, if the capacitor CBO is provided for stabilization of the control voltage, the equation becomes as follows:

$$\Delta VOSC \approx \{(Cg/2)/(N \times Cg + CBO)\} \times (Vdd/2) \qquad (16)$$

$$\approx (Cg/4CBO) \times Vdd$$

As the gate capacitance Cg is several tens of fF, if the capacitor CBO is made 10 pF or so, the oscillation voltage $\Delta VOSC$ becomes a few hundred $\mu V$ and is reduced to a value one order of magnitude larger than the accuracy sought for the control voltage of the voltage-controlled oscillator 105.

FIG. 14 gives waveform diagrams for explaining the operation of the second mode of the PLL circuit of the prior art.

Waveform diagram of FIG. 14A shows the waveform of the reference clock signal $\phi$REF.

Waveform diagram of FIG. 14B shows the waveform of the output signal NOUT of the frequency divider 106.

Waveform diagram of FIG. 14C shows the waveform of the up signal /UP of the phase comparator 101.

Waveform diagram FIG. 14D shows the waveform of the down signal DOWN of the phase comparator 101.

Waveform diagram (E) of FIG. 14 shows the waveform of the output voltage FIL of the lag-lead filter 103.

Waveform diagram (F) of FIG. 14 shows the waveform of the bias voltage PBIAS.

Waveform diagram (G) of FIG. 14 shows the waveform of the bias voltage NBIAS.

In the time $\Delta t$ when the up signal /UP or the down signal DOWN is generated, the output current ICP from the charge pump circuit 102 passes through the resistor RF1 of the lag-lead filter 103 and charges or discharges the capacitor CF1 of the lag-lead filter 103. In the output voltage FIL of the lag-lead filter 103, a rectangular pulse voltage waveform S1 is generated due to the current ICP flowing through the resistor RF1, while a flat waveform voltage S2 is generated along the time axis due to the charging and discharging and retaining of the charge ICP×Δt in the capacitor CF1.

The voltage change $\Delta V1$ of the voltage waveform S1 and the voltage change $\Delta V2$ of the voltage waveform S2 in the output voltage FIL of the lag-lead filter 103 are expressed by the following equations:

$$\Delta V1 = ICP \times RF1 \tag{17}$$

$$\Delta V2 = (ICP \times \Delta t)/CF1 \tag{18}$$

In addition, the area ZS1 of the voltage waveform S1 and the area ZS2 of the voltage waveform S2 are expressed by the following equations:

$$ZS1 = \Delta V1 \times \Delta t \tag{19}$$

$$ZS2 \approx \Delta V2 \times T \tag{20}$$

Here, the sum of the area ZS1 and the area ZS2 (ZS1+ZS2) is related to the phase pull-in, and the area ZS2 is related to the frequency change (pull-in). For example, if the frequency change is designed to be a half of the phase pull-in, since the area ZS1FIL and the area ZS2FIL are substantially equal, the following equation holds:

$$\Delta V2 \approx \Delta V1 \times (\Delta t/T) \tag{21}$$

Since the time $\Delta t$ is shorter than the period T, the voltage $\Delta V2$ becomes sufficiently smaller than the voltage $\Delta V1$.

The output of the bias circuit 107, that is, the bias voltage NBIAS, is generated as a blunted rectangular waveform S1NB and a flat waveform S2NB. The voltage waveform S1NB is the rectangular pulse waveform of the voltage FIL blunted by the capacitor CNB and changes exponentially with a time constant determined by the output resistor RNBO of the bias circuit 107 and the capacitor CNB for voltage stabilization. The voltage waveform S2NB is a waveform corresponding to the voltage waveform S2.

Here, for simplifying the explanation, the case in which the gain of the bias circuit 107 is 1 will be explained. The rising edge of the exponentially changing blunted pulse voltage waveform S1NB can be approximated by the following equation:

$$\Delta V1NB(t) = \Delta V1 \times \{1 - \exp(-t/\tau NB)\} \tag{22}$$
$$\approx \Delta V1 \times (t/\tau NB)$$

where, $\tau NB = CNB \times RNBO$

Therefore, the peak voltage $\Delta V1NB$ can be expressed by the following equation:

$$\Delta V1NB \approx \Delta V1 \times (\Delta t/\tau NB) \tag{23}$$

On the other hand, the falling waveform of the blunted voltage waveform S1NB can be approximated by the following equation:

$$\Delta V1NB(t) = (\Delta V1NB - \Delta V2) \times \exp(-t/\tau NB) + \Delta V2 \tag{24}$$
$$\approx \Delta V1NB \times \exp(-t/\tau NB)$$

At the trailing edge of the reference clock signal $\phi$REF, namely, at the time $t=\alpha T$ ($\approx T/10$), the voltage at which the voltage waveform S1NB has exponentially attenuated can be expressed by the following equation:

$$\Delta V1NB(\alpha T) \approx \Delta V1NB \times \exp\{-(\alpha T)/\tau NB\} \approx \tag{25}$$
$$\Delta V1 \times (\Delta t/\tau NB) \times \exp\{-(\alpha T)/\tau NB\}$$

For displaying pictures or text, at the trailing edge of the reference clock signal $\phi$REF, namely, at the left end of the screen, the voltage waveform S1NB must be sufficiently attenuated, so it is a criterion of design that the following equation be satisfied:

$$\Delta V1NB(\alpha T) \leq \Delta V2 \tag{26}$$

Entering equation (25) and equation (21) into equation (26) to modify it, the following equation is obtained:

$$T/\tau NB \leq \exp(\alpha T/\tau NB) \tag{27}$$

Therefore, the same equation as equation (12) of the first mode can be obtained. If $\alpha = 1/10$, the next equation holds:

$$\tau NB \leq T/35.8 \tag{28}$$

However, when the bias voltage NBIAS and the bias voltage PBIAS are generated in the bias circuit 107 as in the second mode, a frequent practice is to receive one bias voltage and generate the other bias voltage as shown in the circuit example of FIG. 16. The waveform diagram of FIG. 14 is of the case where the bias voltage NBIAS is received and the bias voltage PBIAS is generated.

In this case, the waveform of the bias voltage PBIAS has a combined waveform of a further blunted voltage waveform S1PB generated by inverting the blunted pulse waveform S1NB of the bias voltage NBIAS and a flat voltage waveform S2PNB corresponding to the flat voltage waveform S2NB of the bias voltage NBIAS.

Here, for facilitating understanding of the explanation, the following explanation is given assuming the bias voltage PBIAS is not inverted and switching the terms "rising edge" and "trailing edge".

The rising edge of the exponentially changing strongly blunted waveform S1PB first rises up toward the peak voltage $\Delta V1NB$ of the bias voltage NBIAS, so can be approximated by the following equation:

$$|\Delta V1PB(t)| \approx \Delta V1NB \times \{1 - \exp(-t/\tau PB1)\} \tag{29}$$

where, $\tau PB1 = CPB \times RPBO$.

However, since the voltage of the bias voltage NBIAS decreases gradually, the voltage change of the bias voltage PBIAS gradually levels off. When the time constant $\tau NB \approx \tau PB1$, the bias voltage NBIAS and the bias voltage PBIAS cross near the time $t \approx \tau NB$. At this time, the bias voltage PBIAS becomes the peak voltage $\Delta V1NB$. Namely, near the time $t \approx \tau NB$, the voltage $\Delta V1NB$ ($\tau NB$)=$\Delta V1NB$ (0)/e, so the voltage change ΔV1PB of the bias voltage PBIAS can be expressed by the following equation:

$$|\Delta V1PB(t)| \approx \Delta V1NB/e \quad (30)$$

The voltage waveform S1PB at the time when the bias voltage PBIAS starts to decrease from the peak can be roughly approximated by the following equation:

$$|\Delta V1PB(t)| \approx |\Delta V1PB| \times \exp\{-(t-\tau PB2)/\tau PB2\} \quad (31)$$
$$\approx \Delta V1NB \times \exp(-t/\tau PB2)$$
where, $\tau PB2 \approx \sqrt{e} \times \tau PB1 \approx \sqrt{e} \times CPB \times RPB0$ Furthermore, the waveform of the portion of the voltage waveform S1PB after removal of the tail can be roughly approximated by the following equation:

$$|\Delta V1PB(t)| \approx \Delta V1NB \times [\exp(-t/\tau NB) + \quad (32)$$
$$\exp\{-t/\sqrt{(\tau NB^2 + \tau PB1^2)}\}]$$
$$\approx \Delta V1NB \times [\exp(-t/\tau NB) +$$
$$\exp\{-t/(\sqrt{2} \times \tau PB1)\}]$$

For displaying pictures or text, at the trailing edge of the reference clock signal φREF, namely, at the left end of the screen, the strongly blunted voltage S1PB must be sufficiently attenuated, so it is a criterion of design that the following equation be satisfied:

$$\Delta V1PB(\alpha T) \leq \Delta V2 \quad (33)$$

By assuming the time constant $\tau NB \approx \tau PB1 \approx \tau B0$ and entering equation (32) and equation (21) into equation (33) to modify it, the following equation is obtained:

$$T/\tau B0 \leq 1/[\exp(-\alpha T/\tau B0) + \exp\{-\alpha T/(\sqrt{2} \times \tau B0)\}] \quad (34)$$

Therefore, the same equation as equation (12) of the first mode can be obtained. When α=1/10, the next equation holds:

$$\tau B0 \leq T/60.2 \quad (35)$$

In equation (35), for example,
if T=64 μsec, τB0≤1.06 μsec
if T=10 μsec, τB0≤166 nsec If the value of the output resistor RNB0 or the output resistor RPB0 of the bias circuit 107 is set large to reduce the power consumption of the bias circuit 107, the value of the time constant τB0 also becomes larger and it becomes difficult to satisfy equation (33). That is, the bias voltage continues changing even after the trailing edge of the reference clock signal φREF, so there arises a problem that the effect of the phase correction performed at the trailing edge of the reference clock signal φREF ends up being reduced.

Under standard condition, designing the circuit to satisfy equation (11) or equation (33) does not pose that much of a problem, but if considering the power voltage or temperature and the variability in processes, it is necessary to further secure, for example, approximately a 200% margin. This is not easy. In addition, although not shown, when both the low-pass filter 104 and the bias circuit 107 cause double blunting of the input voltage waveform of the voltage-controlled oscillator 105, needless to say the above problem becomes more severe.

SUMMARY OF THE INVENTION

An object of the present invention is to provide a phase-locked loop circuit and a delay-locked loop circuit able to reduce frequency change due to noise and able to reduce frequency change after a phase pull-in operation performed in each cycle of a reference clock signal.

In order to achieve the above object, the present invention provides a phase-locked loop circuit comprising a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase, a smoothing means for smoothing the leading phase signal or the delayed phase signal output from the phase comparison means and outputting the result as a control signal, a superposing means for superposing the leading phase signal or the delayed phase signal output from the phase comparison means on the control signal, and an oscillation circuit for receiving the control signal superposed with other signals by the superposing means and outputting the feedback signal of a frequency corresponding to the control signal to the phase comparison means.

The superposing means includes a capacitor receiving the leading phase signal or the delayed phase signal at one terminal and connected to an output line of the control signal of the smoothing means at another terminal. The smoothing means includes a current outputting means for outputting a current corresponding to the leading phase signal or the delayed phase signal, a series circuit having a resistor and a capacitor receiving the output current from the current outputting means, and a noise filter for receiving the voltage of the series circuit and outputting said control signal after removing noise components included in the voltage.

According to the phase-locked loop circuit employing the above configuration, in the above phase comparison means, the size of a leading phase or a delayed phase of a feedback signal is detected with respect to a reference signal, and a leading phase signal having a pulse width corresponding to the size of the leading phase or a delayed phase signal having a pulse width corresponding to the size of the delayed phase is output.

In the current outputting means of the smoothing means, a current corresponding to the leading phase signal or a current corresponding to the delayed phase signal is output, and a voltage corresponding to the output current flowing through the series circuit is input to the noise filter. In the noise filter, the control signal after removing noise components included in the voltage of the series circuit is output.

The control signal is superposed on the leading phase signal or the delayed phase signal via a capacitor of the superposing means and is input to the oscillation circuit. Then, in the oscillation circuit, a feedback signal of a frequency corresponding to the input control signal is output.

The phase-locked loop circuit of the present invention may also have a phase comparison means for detecting a size of a leading phase or a delayed phase of a feedback signal with respect to a reference signal and outputting a leading phase signal having a pulse width corresponding to the size of the leading phase or a delayed phase signal having a pulse width correesponding to the size of the delayed phase, a smoothing means for smoothing the leading phase signal or the delayed phase signal output from the phase compairson means and outputting the result as a control signal, a bias signal generating means for outputting a first bias signal and a second signal corresponding to the control signal, a nose filter for removing noise components included in the first bias signal and the second signal, a first superposing means for superposing the leading phase signal or the delayed phase signal output from the phase comparison means on the first bias signal, a second superposing means for superposing the leading phase signal or the delayed phase signal output from the phase comparison means on the seocnd bias signal, and an oscillation cirucit which includes a plurality of delay stages for exchanging and outputting a first current variable according to the first bias signal superposed with other signals by the first superposing means and a second current variable according to the second bias signal superposed with other signals by the second superposing means according to levels of input signals, feeds back an output signal of a last delay stage to an input of a first delay stage, and outputs an output signal of one of the delay stages as the feedback signal to the phase comparison means.

Further, first superposing means includes a capacitor receiving the leading phase signal or the delayed phase signal at one terminal and connected to an output line of the first bias signal of the bias signal generating means at another terminal. The second superposing means includes a capacitor receiving the leading phase signal or the delayed phase signal at one terminal and connected to an output line of the second bias signal of the bias signal generating means at another terminal.

The smoothing means includes a current outputting means for outputting a current corresponding to the leading phase signal or a current corresponding to the delayed phase signal and a series circuit having a resistor and a capacitor receiving the output current from the current outputting means. The bias signal generating means generates the first bias signal and the second bias signal according to a voltage of the series circuit.

According to the phase-locked loop circuit employing the above configuration, in the above phase comparison means, the size of a leading phase or a delayed phase of a feedback signal is detected with respect to a reference signal, and a leading phase signal having a pulse width corresponding to the size of the leading phase or a delayed phase signal having a pulse width corresponding to the size of the delayed phase is output.

In the current outputting means of the smoothing means, a current corresponding to the leading phase signal or a current corresponding to the delayed phase signal is output, and the first bias signal and the second bias signal corresponding to the voltage of the series circuit that receives the output current from the current outputting means are generated in the bias signal generating means.

The first bias signal from which the noise components have been removed in the noise filter is superposed with the leading phase signal or the delayed phase signal through the capacitor of the first superposing means and input to the oscillation circuit. The second bias signal from which the noise components have been removed in the noise filter is superposed with the leading phase signal or the delayed phase signal through the capacitor of the second superposing means and input to the oscillation circuit.

In the delay stages of the oscillation circuit, a first current variable according to the first bias signal and a second current variable according to the second bias signal are exchanged and output according to levels of input signals. The output signal of the last stage of the delay stages is fed back to the input of the first stage of the delay stages, whereby oscillation is initiated. The output signal of one of the delay stages is output as the feedback signal.

A delay-locked loop circuit of the present invention has a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase, a smoothing means for smoothing the leading phase signal or the delayed phase signal output from the phase comparison means and outputting the result as a control signal, a superposing means for superposing the leading phase signal or the delayed phase signal output from the phase comparison means on the control signal, and a delay circuit for receiving the control signal superposed with other signals by the superposing means and the reference signal and outputting to the phase comparison means the feedback signal having a delay corresponding to the control signal relative to the reference signal.

In addition, the superposing means includes a capacitor receiving the leading phase signal or the delayed phase signal at one terminal and connected to an output line of the control signal of the smoothing means at another terminal. The smoothing means includes a current outputting means for outputting a current corresponding to the leading phase signal or a current corresponding to the delayed phase signal, a series circuit having a resistor and a capacitor receiving the output current from the current outputting means, and a noise filter for receiving the voltage of the series circuit and outputting said control signal after removing noise components included in the voltage.

According to the delay-locked loop circuit employing the above configuration, in the above phase comparison means, the size of a leading phase or a delayed phase of a feedback signal is detected with respect to a reference signal, and a leading phase signal having a pulse width corresponding to the size of the leading phase or a delayed phase signal having a pulse width corresponding to the size of the delayed phase is output.

In the current outputting means of the smoothing means, a current corresponding to the leading phase signal or a current corresponding to the delayed phase signal is output, and a voltage corresponding to the output current flowing through the series circuit is input to the noise filter. In the noise filter, the control signal after removing noise components included in the voltage of the series circuit is output.

The control signal is superposed on the leading phase signal or the delayed phase signal via a capacitor of the superposing means and input to the delay circuit. Then, in the delay circuit, a feedback signal having a delay corresponding to the input control signal is output.

The delay-locked loop circuit of the present invention may also have a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase, a smoothing means for smoothing the leading phase signal or the delayed phase signal output from the phase comparison means and outputting the result as a control signal, a bias signal generating means for outputting a first bias signal and a second bias signal corresponding to the control signal, a noise filter for removing noise components included in the first bias signal and the second signal, a first superposing means for superposing the leading phase signal or the delayed phase signal output from the phase comparison means on the first bias signal, a second superposing means for superposing the leading phase signal or the delayed phase signal output from the phase comparison means on the second bias signal, and a delay circuit which includes a plurality of delay stages for exchanging and outputting a first current variable according to the first bias signal superposed with other signals by the first superposing means and a second current variable according to the second bias signal superposed with other signals by the second superposing means according to levels of input signals, inputs the reference signal to a first delay, and outputs an output signal of one of the delay stages as the feedback signal to the phase comparison means.

In addition, the first superposing means includes a capacitor receiving the leading phase signal or the delayed phase signal at one terminal and connected to an output line of the first bias signal of the bias signal generating means at another terminal, and the second superposing means includes a capacitor receiving the leading phase signal or the delayed phase signal at one terminal and connected to an output line of the second bias signal of the bias signal generating means at another terminal. The smoothing means includes a current outputting means for outputting a current corresponding to the leading phase signal or the delayed phase signal, a series circuit having a resistor and a capacitor receiving the output current from the current outputting means, and the bias signal generating means outputting the first bias signal and the second bias signal according to a voltage of the series circuit.

According to the delay-locked loop circuit employing the above configuration, in the above phase comparison means, the size of a leading phase or a delayed phase of a feedback signal is detected with respect to a reference signal, and a leading phase signal having a pulse width corresponding to the size of the leading phase or a delayed phase signal having a pulse width corresponding to the size of the delayed phase is output.

In the current outputting means of the smoothing means, a current corresponding to the leading phase signal or a current corresponding to the delayed phase signal is output, and a first bias signal and a second bias signal corresponding to the voltage of the series circuit that receives the output current from the current outputting means are generated in the bias signal generating means.

The first bias signal from which the noise components have been removed in the noise filter is superposed with the leading phase signal or the delayed phase signal through the capacitor of the first superposing means and input to the oscillation circuit. The second bias signal from which the noise components have been removed in the noise filter is superposed with the leading phase signal or the delayed phase signal through the capacitor of the second superposing means and input to the oscillation circuit.

In the delay stages of the delay circuit, a first current variable according to the first bias signal and a second current variable according to the second bias signal are exchanged and output according to levels of input signals. The reference clock signal is input to the first stage of the delay stages, while the output signal of one of the delay stages is output as the feedback signal.

BRIEF DESCRIPTION OF THE DRAWINGS

These and other objects and features of the present invention will become clearer from the following description with reference to the attached drawings, wherein.

DESCRIPTION OF THE PREFERRED EMBODIMENTS

Below, preferred embodiments will be described with reference to the accompanying drawings.

First Embodiment

Figure 1:
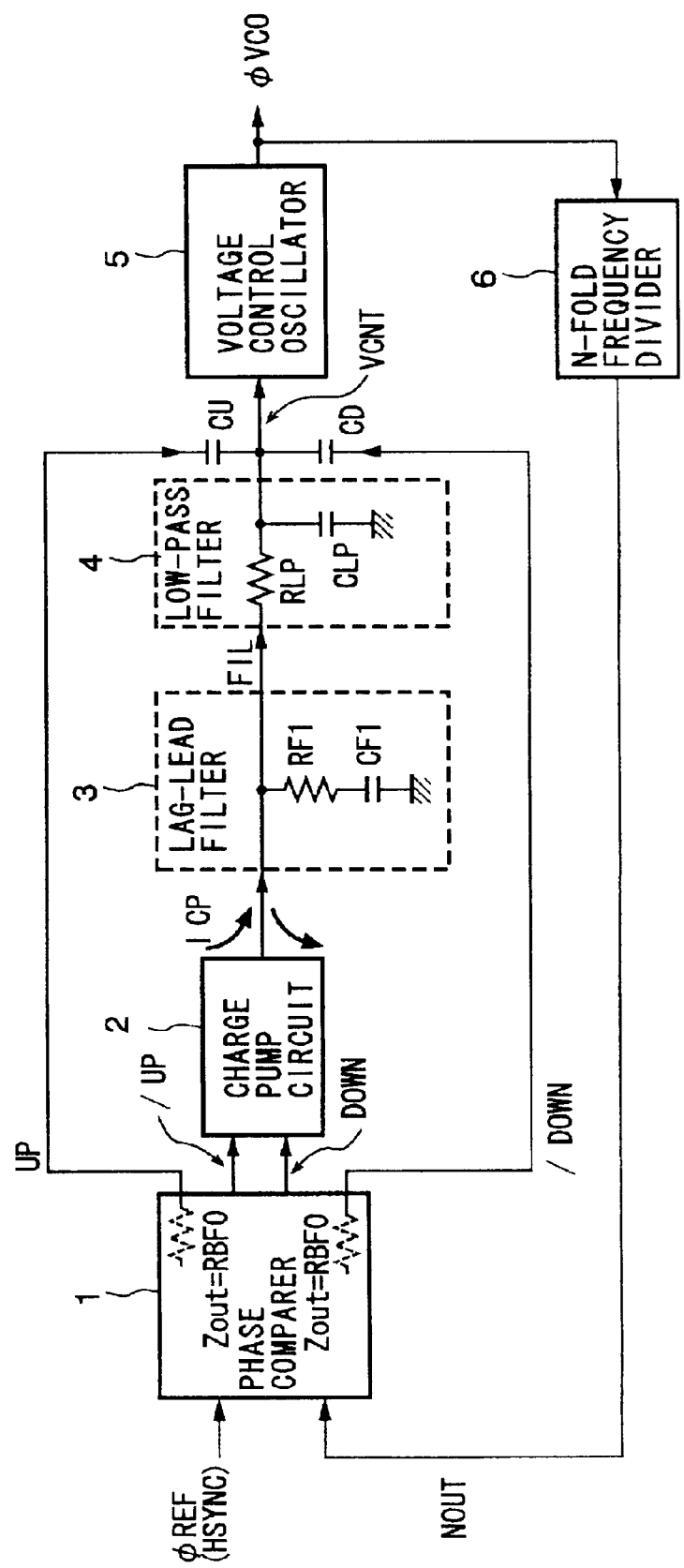
FIG. 1 is a view of the configuration of a first embodiment of a PLL circuit according to the present invention.

FIG. 1 is a view of the configuration of a first embodiment of a PLL circuit according to the present invention.

The PLL circuit shown in FIG. 1 includes a phase comparator 1, a charge pump circuit 2, a lag-lead filter 3, a low-pass filter 4, a voltage-controlled oscillator 5, a frequency divider 6, a capacitor CU, and a capacitor CD.

The phase comparator 1 compares phases of a reference signal φREF and an output signal NOUT of the frequency divider 6 and outputs an up signal and an inverted up signal /UP and a down signal and an inverted down signal /DOWN according to the result of comparison.

The charge pump circuit 2 receives the up signal /UP and the down signal DOWN from the phase comparator 1 and outputs a charging and discharging current ICP to the lag-lead filter 3.

The lag-lead filter 3, for example, is comprised of a resistor RF1 and a capacitor CF1 connected in series between the output of the charge pump circuit 2 and the ground line. It receives the charging and discharging current ICP and outputs the generated voltage FIL of the series circuit to the low-pass filter 4.

The low-pass filter 4, for example, is comprised of a resistor RLP and a capacitor CLP connected in series between the output of the charge pump circuit 2 and the ground line. It receives the voltage FIL of the lag-lead filter 3 and outputs a voltage LPO of the capacitor CLP corresponding to this to the voltage-controlled oscillator 5.

The voltage-controlled oscillator 5 receives the output voltage LPO of the low-pass filter 4 and outputs a signal φVCO having a frequency corresponding to this.

The frequency divider 6 divides the output signal φVCO of the voltage-controlled oscillator 5 by a certain division ratio and outputs a signal NOUT to the phase comparator 1.

The capacitor CU and the capacitor CD superpose the up signal UP and the down signal /DOWN on the output voltage of the low-pass filter 4.

Figure 11:
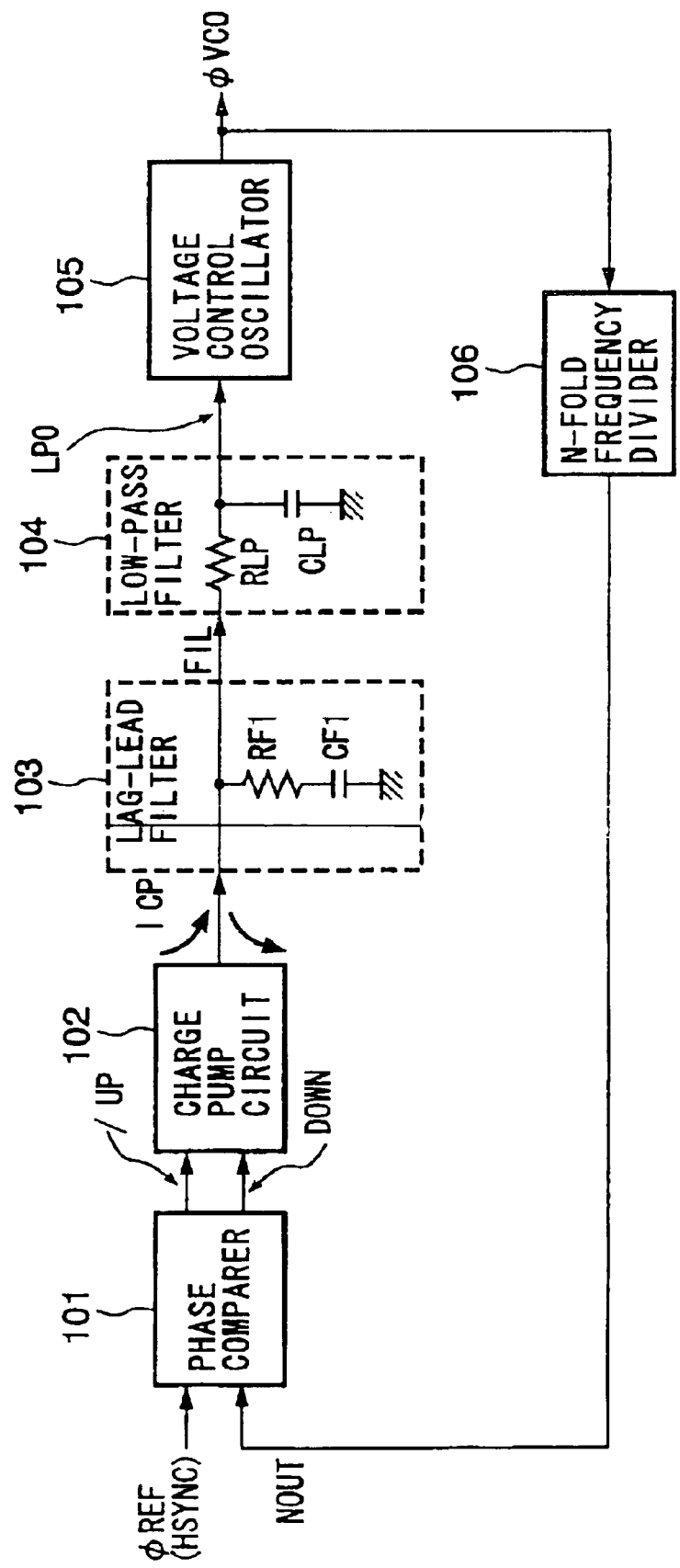
FIG. 11 is a view of the configuration of a first mode of a PLL circuit of the prior art using a lag-lead filter.
Figure 12:
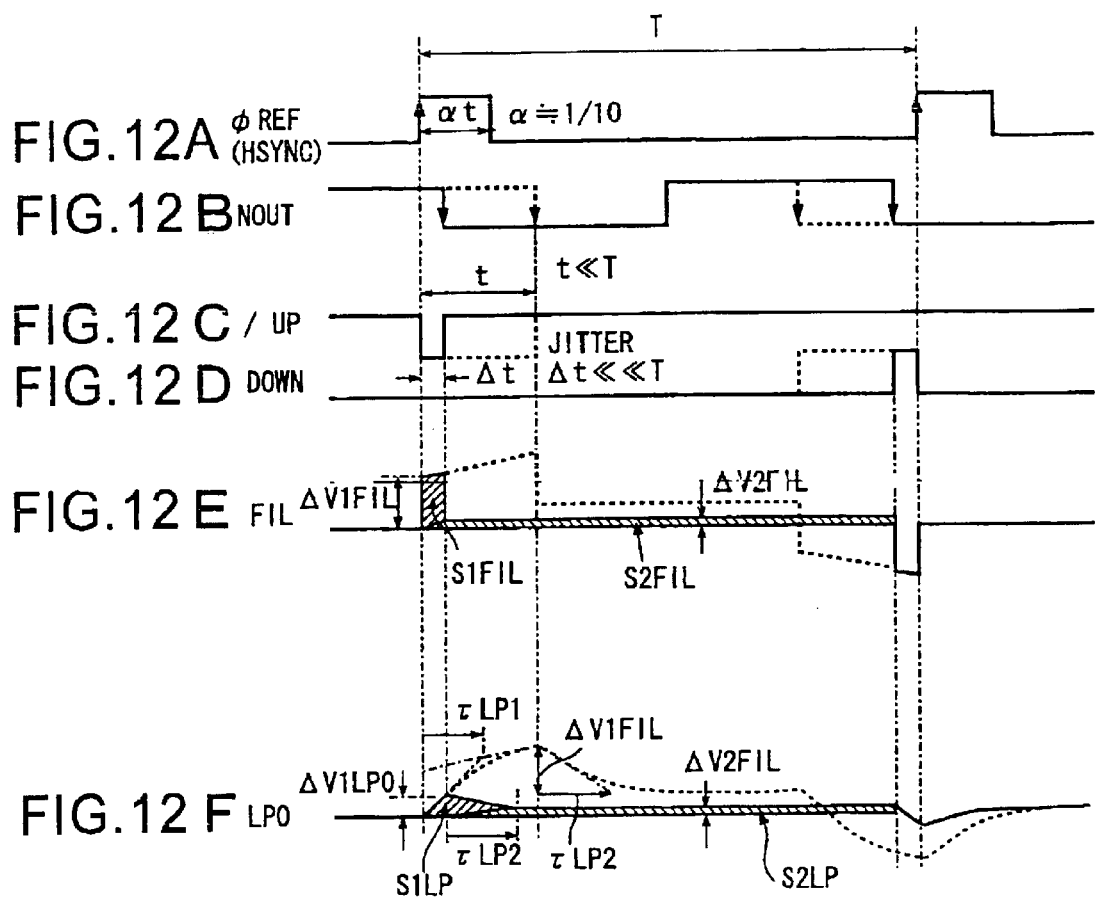
FIGS. 12A to 12F are waveform diagrams for explaining the operation of the first mode of the PLL circuit of the prior art.

The PLL circuit of the present invention shown in FIG. 1 differs from the PLL circuit of the prior art shown in FIG. 11 in the points that in the PLL circuit in FIG. 1, the capacitor CU and capacitor CD are provided on the output line of the low-pass filter 4, the outputs of the phase comparator 1, that is, the up signal UP and down signal /DOWN, are input to these capacitors, and a rectangular pulse waveform is input to the voltage-controlled oscillator accoirdng to the voltage-division ratio of the capacitances of the capacitor CLP of the low-pass filter and these capacitors.

Figure 2:
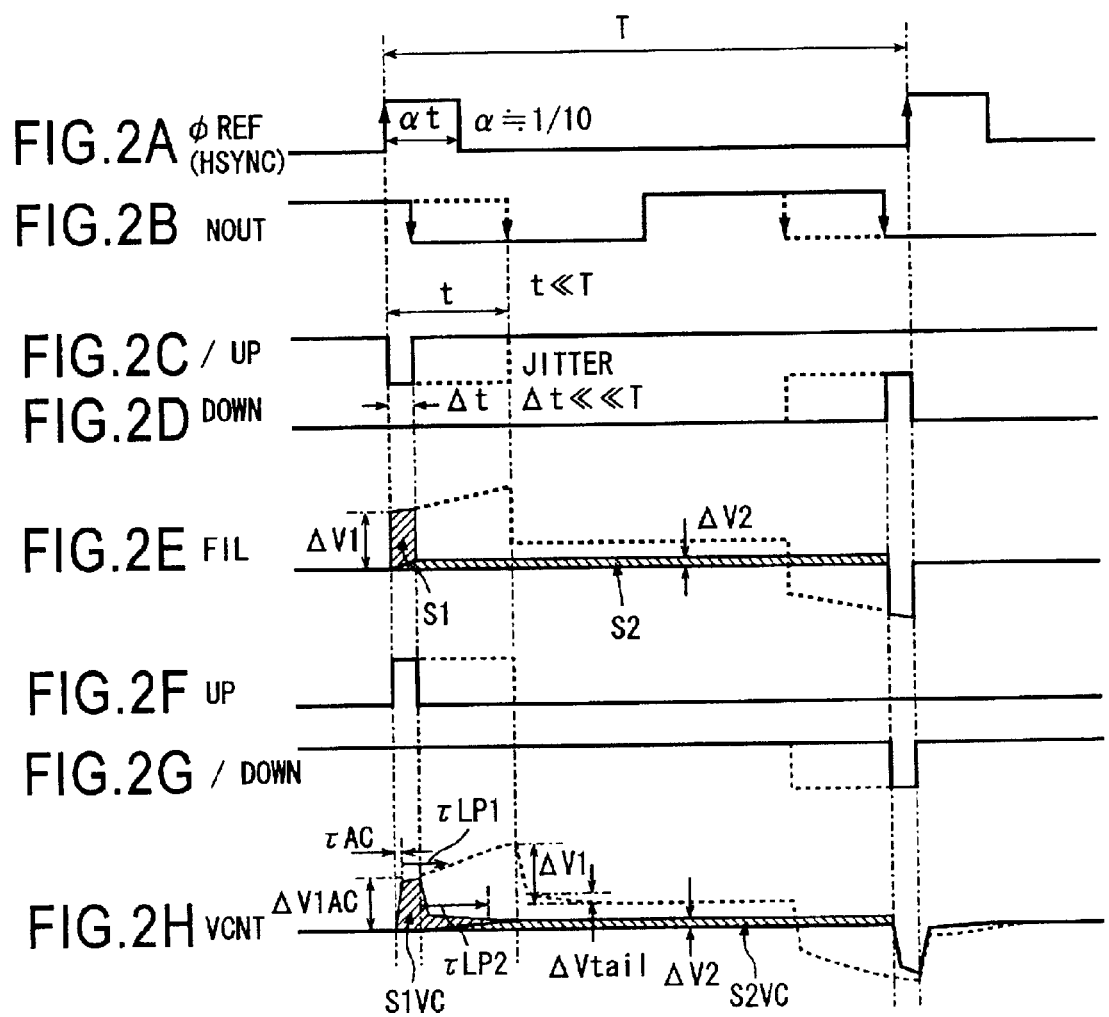
FIGS. 2A to 2H are waveform diagrams for explaining the operation of the first embodiment of the PLL circuit according to the present invention.

FIG. 2 gives waveform diagrams for explaining the operation of the first embodiment of a PLL circuit according to the present invention.

Waveform diagram of FIG. 2A shows the waveform of the reference clock signal φREF.

Waveform diagram of FIG. 2B shows the waveform of the output signal NOUT of the frequency divider 6.

Waveform diagram of FIG. 2C shows the waveform of the up signal /UP of the phase comparator 1.

Waveform diagram of FIG. 2D shows the waveform of the down signal DOWN of the phase comparator 1.

Waveform diagram of FIG. 2E shows the waveform of the output voltage FIL of the lag-lead filter 3.

Waveform diagram of FIG. 2F shows the waveform of the up signal /UP of the phase comparator 1.

Waveform diagram of FIG. 2G shows the waveform of the down signal /DOWN of the phase comparator 1.

Waveform diagram of FIG. 2H shows the waveform of the output voltage VCNT of the low-pass filter 4.

The phase comparator 1 compares the timing of the rising edge of the reference clock signal φREF and the trailing edge of the output signal NOUT of the frequency divider 6. If the trailing edge of the signal NOUT is late relative to the rising edge of the reference clock signal φREF, a low level pulse signal, that is, the up signal /UP, is output. If the trailing edge of the signal NOUT is earlier, a high level pulse signal, that is, the down signal DOWN, is output.

The up signal /UP, for example, is input to the gate of a p-channel MOS transistor on a not shown power line side of the charge pump circuit. By inputting a low level pulse signal to the up signal /UP, the p-channel MOS transistor is turned on, and the charging and discharging current ICP is supplied to the lag-lead filter 3.

In addition, the down signal DOWN, for example, is input to the gate of an n-channel MOS transistor on a not shown ground line side of the charge pump circuit. By inputting a high level pulse signal to the down signal DOWN, the n-channel MOS transistor is turned on, and the charging and discharging current ICP is supplied to the lag-lead filter 3.

Due to the charging and discharging current ICP output from the charge pump circuit 2, the output voltage FIL of the lag-lead filter 3 and the output voltage VCNT of the low-pass filter 4 change. Due to this, the oscillation frequency of the voltage-controlled oscillator 5 increases or decreases.

In the time Δt when the up signal /UP or the down signal DOWN is generated, the output current ICP from the charge pump circuit 2 passes through the resistor RF1 of the lag-lead filter 3 and the resistor RLP of the low-pass filter 4 and charges or discharges the capacitor CF1 of the lag-lead filter 3 and the capacitor CLP of the low-pass filter 4. The output voltage FIL of the lag-lead filter 3 has a combined waveform of a rectangular voltage waveform S1 generated by the flow of the current ICP through the parallel resistance of the resistor RF1 and the resistor RLP and a flat waveform along the time axis generated by charging and discharging the parallel capacitance of the capacitor CF1 and the capacitor CLP and retaining the charge.

In addition, in the first embodiment of the present invention, because the output pulse of the phase comparator 1 is superposed on the output voltage of the low-pass filter 4 through the capacitor CU and capacitor CD, it is possible to strongly reduce the blunting of the pulse shape of the output voltage FIL of the low-pass filter 4 compared with the first mode of the prior art.

If capacitor CU=CD=CAC, the rising time and falling time τAC of the pulse waveform S1VC of the output voltage FIL of the low-pass filter 4 can be expressed by the following equation using the output impedance RBF0 of the phase comparator 1:

$$\tau AC \approx CAC \times RBFO \tag{36}$$

On the other hand, the voltage change ΔV1AC of the pulse waveform S1VC propagated via the capacitor can be expressed by the following equation using the output amplitude VB0 of the phase comparator 1:

$$\Delta V1AC = \{CAC/(CLP+2CAC)\} \times VBO \tag{37}$$

For example, if the amplitude VB0 of the phase comparator 1=power voltage Vdd=2V to 3.6V and the voltage change ΔV1AC of the pulse S1VC=0.1V to 0.2V, from equation (37), when (CLP+2CAC)=10 pF, the capacitor CAC becomes 0.3 pF to 1 pF. Therefore, for example, if capacitor CAC=0.5 pF and impedance RBF0=2.2 kΩ, from equation (36), the time constant τAC≈1.1 ns.

The voltage waveform ΔVtail of the portion of the voltage waveform S1VC remaining after the output pulse of the phase comparator 1 is over minus the tail can be approximated by the following equation:

$$\Delta Vtail(t) \approx (\Delta V1 - \Delta V1AC) \times \exp(-t/\tau LP2) \tag{38}$$

The noise due to the different grounding points of the capacitor CF1 and the voltage-controlled oscillator 5 is reduced by the low-pass filter 4 of a time constant τLP2. Furthermore, by designing the circuit so that ΔV1=ΔV1AC under standard conditions or worst conditions, it is possible to make the waveform ΔVtail(t) of the portion of the reference clock signal φREF after removal of the tail from the trailing edge≈0.

The variability of the voltage change ΔV1 of the output of the lag-lead filter 3 is caused mainly by the fluctuation of the output current of the charge pump circuit 2 and can be suppressed to for example −33% to +55%. In addition, the variability of the voltage change ΔV1 of the output of the low-pass filter 4 is mainly caused by the variability of the power voltage and can be suppressed to for example −10% to +10%. In addition, the power voltage may be considered −10% when the output current of the charge pump circuit 2 is −33% and +10% when the output current of the charge pump circuit is +50%, so the following equation holds:

$$\Delta Vtail = -0.23 \times \Delta V1 \sim 0.4 \times \Delta V1 \quad (39)$$

Namely, the voltage change of the pulse waveform at the output of the low-pass filter 4 at the trailing edge of the reference clock signal φREF can be reduced to approximately ⅓ even considering variability.

Second Embodiment

Figure 3:
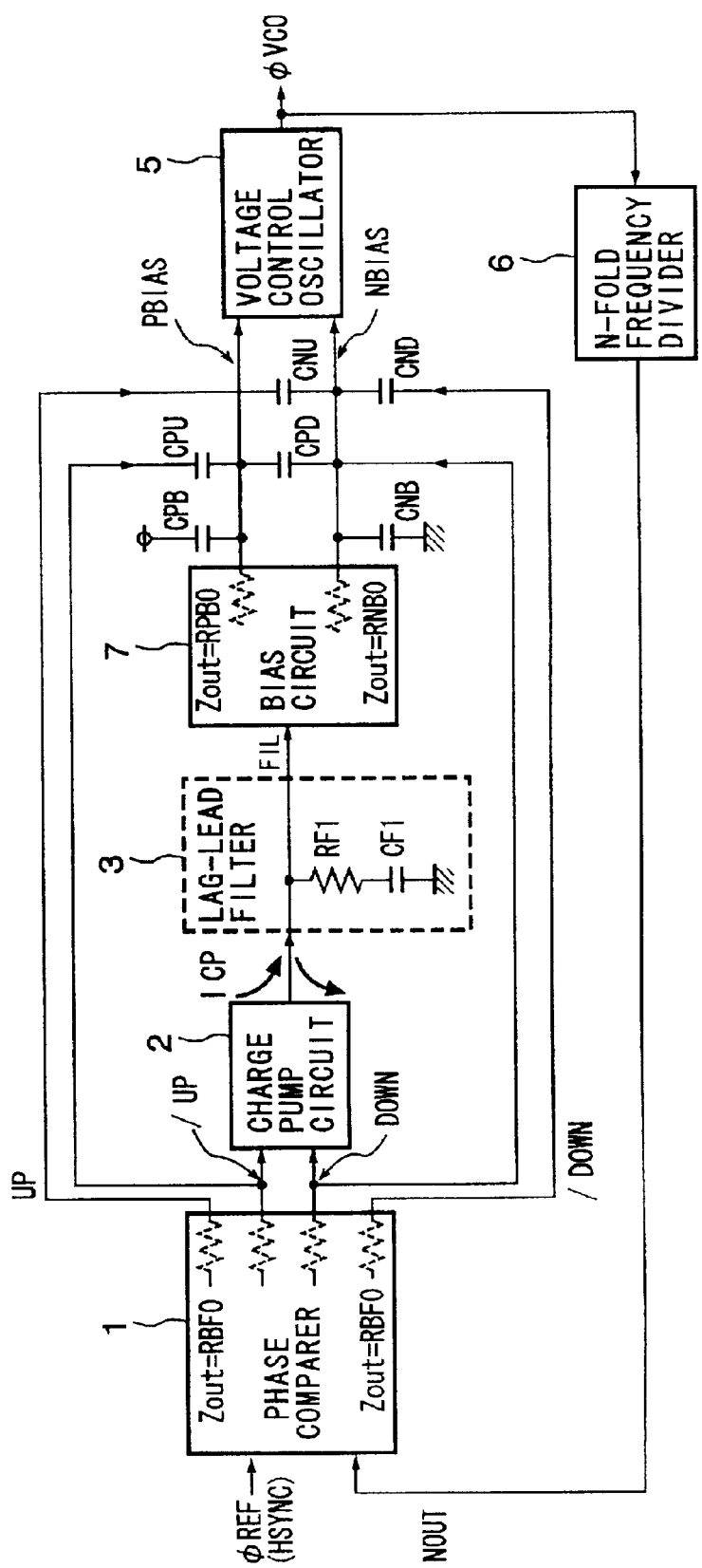
FIG. 3 is a view of the configuration of a second embodiment of a PLL circuit according to the present invention.

FIG. 3 is a view of the configuration of a second embodiment of a PLL circuit according to the present invention.

The PLL circuit shown in FIG. 3 includes a phase comparator 1, a charge pump circuit 2, a lag-lead filter 3, a bias circuit 7, a voltage-controlled oscillator 5, a frequency divider 6, a capacitor CPB, a capacitor CNB, a capacitor CPU, a capacitor CPD, a capacitor CNU, and a capacitor CND.

The same reference numerals in FIG. 3 and FIG. 1 refer to the same constituent elements.

Figure 15:
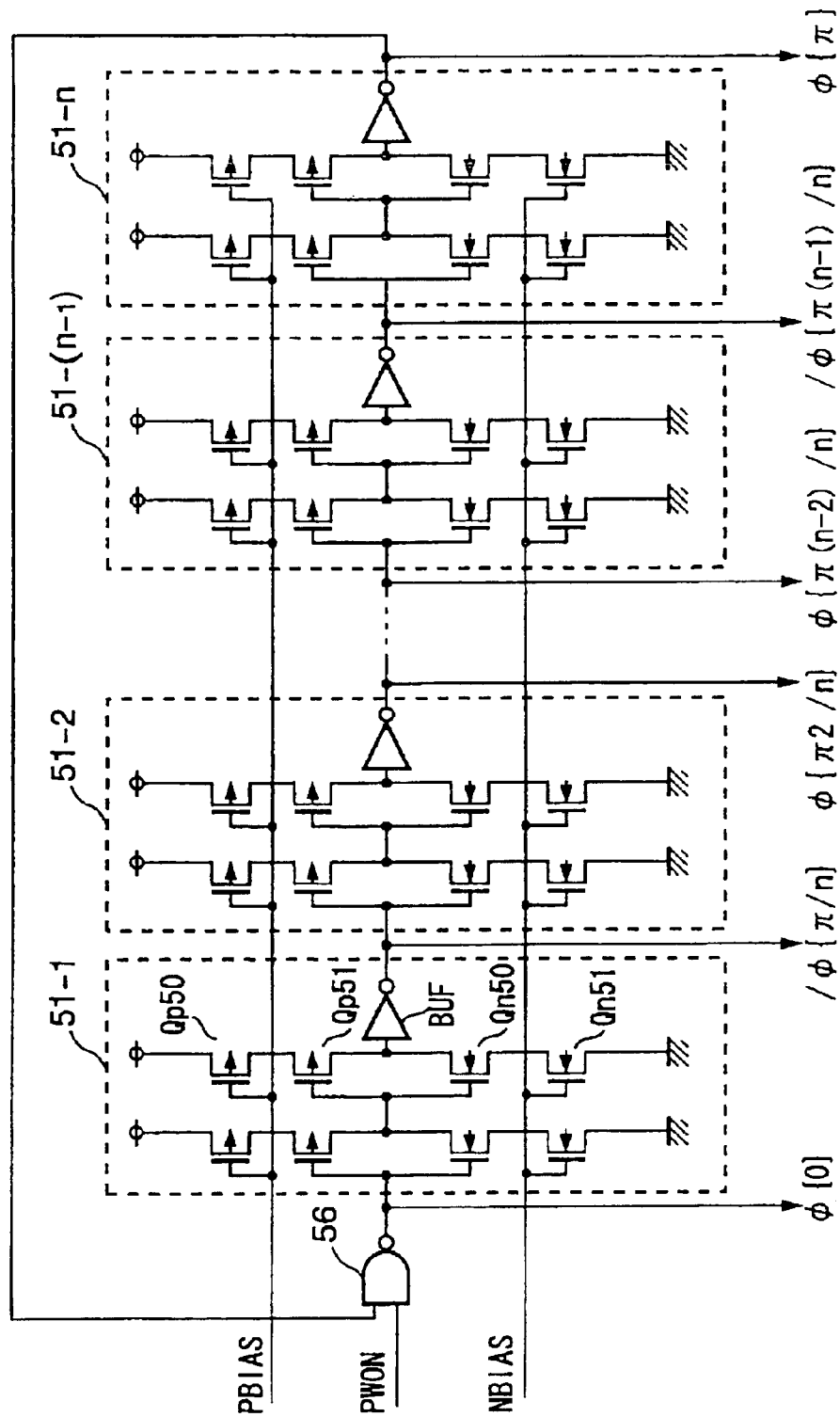
FIG. 15 is a view showing an example of a circuit of a voltage-controlled oscillator.

The voltage-controlled oscillator 5 for example has a circuit as shown in FIG. 15 described above.

Figure 16:
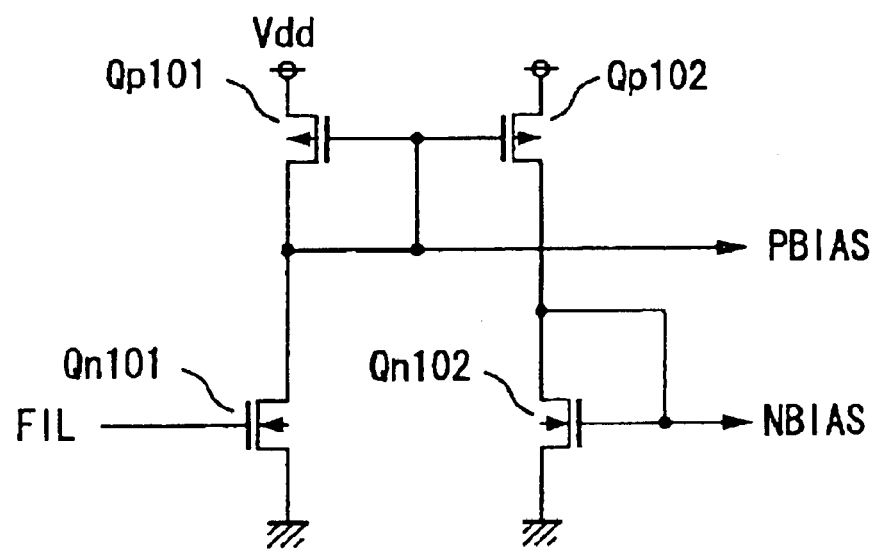
FIG. 16 is a circuit diagram showing an example of a bias circuit.

The bias circuit 7 for example has a circuit as shown in FIG. 16 described above.

Figure 13:
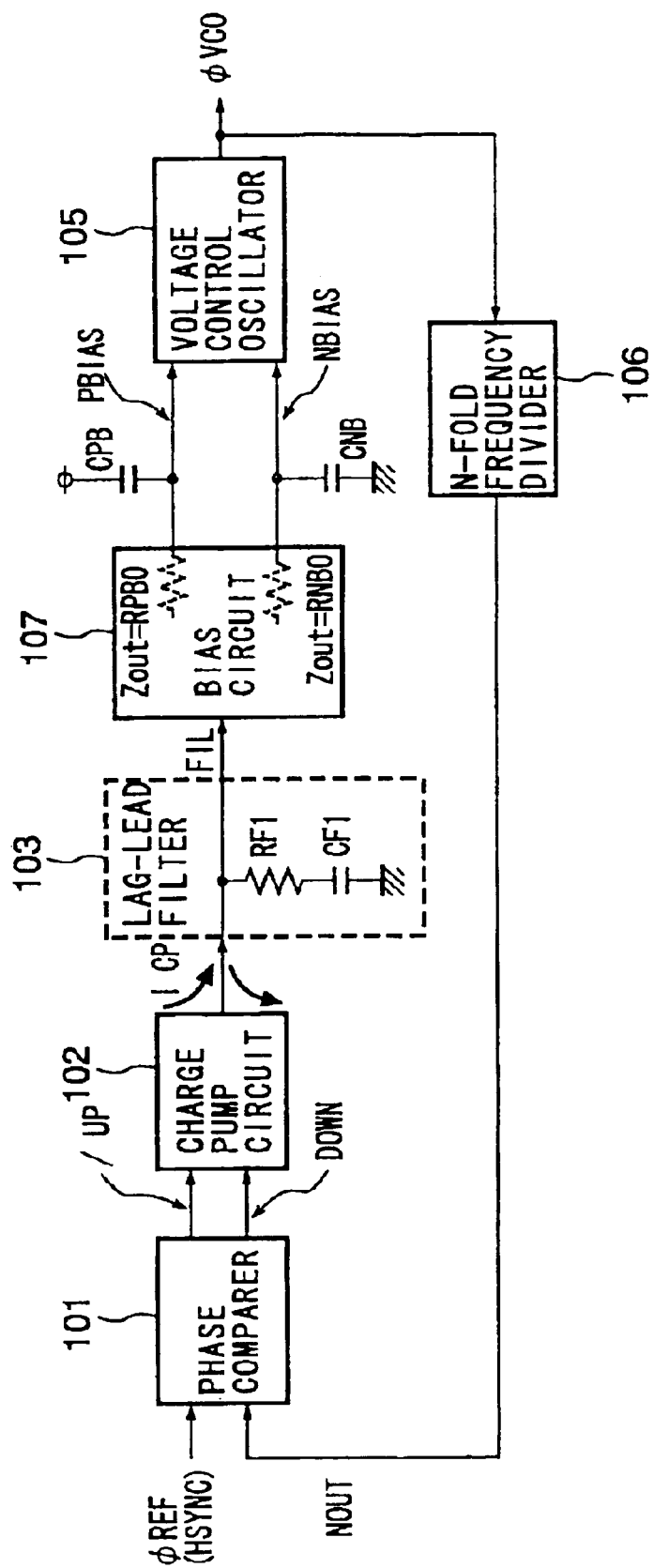
FIG. 13 is a view of a configuration of a second mode of a PLL circuit of the prior art using a lag-lead filter.
Figure 14:
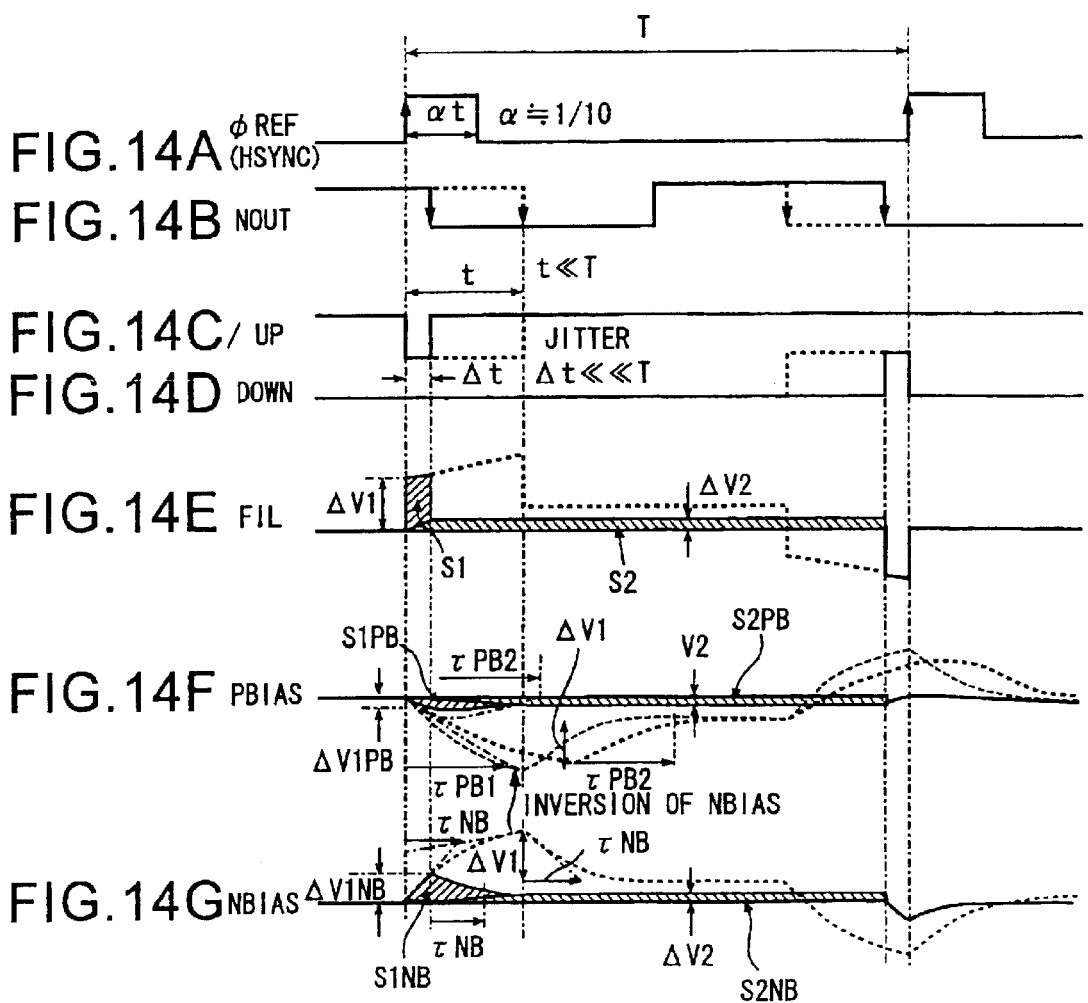
FIGS. 14A to 14G are waveform diagrams for explaining the operation of the second mode of the PLL circuit of the prior art.

The PLL circuit of the present invention shown in FIG. 3 differs from the PLL circuit of the prior art shown in FIG. 13 in the point that in the PLL circuit in FIG. 3, a capacitor CNU and a capacitor CND are provided on the output line of the bias voltage NBIAS, the outputs of the phase comparator 1, that is, the up signal UP and down signal /DOWN, are input to these capacitors, and these pulses are superposed on the bias voltage NBIAS according to the voltage-division ratio of the capacitances of these capacitors and the capacitor CNB and in the point that a capacitor CPU and a capacitor CPD are provided on the output line of the bias voltage PBIAS and the up signal /UP and down signal DOWN are superposed on the bias voltage PBIAS.

Figure 4:
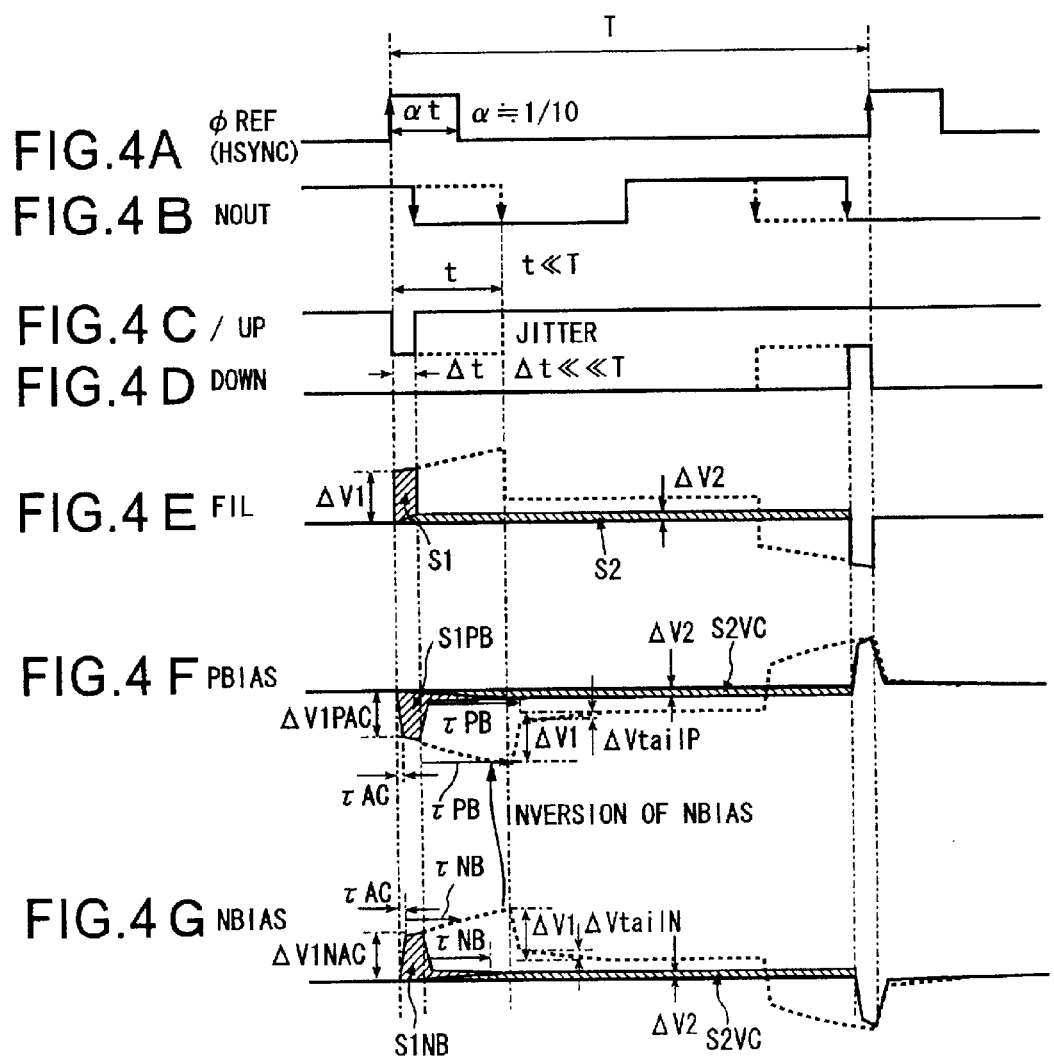
FIGS. 4A to 4G are waveform diagrams for explaining the operation of the second embodiment of a PLL circuit according to the present invention.

FIG. 4 gives waveform diagrams for explaining the operation of the second embodiment of the PLL circuit according to the present invention.

Waveform diagram of FIG. 4A shows the waveform of the reference clock signal φREF.

Waveform diagram of FIG. 4B shows the waveform of the output signal NOUT of the frequency divider 6.

Waveform diagram of FIG. 4C shows the waveform of the up signal /UP of the phase comparator 1.

Waveform diagram of FIG. 4D shows the waveform of the down signal DOWN of the phase comparator 1.

Waveform diagram of FIG. 4E shows the waveform of the output voltage FIL of the lag-lead filter 3.

Waveform diagram of FIG. 4F shows the waveform of the bias voltage PBIAS.

Waveform diagram of FIG. 4G shows the waveform of the bias voltage NBIAS.

In the second embodiment of the present invention, because the output pulse of the phase comparator 1 is transmitted through the capacitor CNU, capacitor CND, capacitor CPU, and capacitor CPD, it is possible to strongly reduce the blunting of the pulse waveform of the output of the bias circuit 7 compared with the second mode of the prior art.

If the output resistor RBF0 of the phase comparator 1 is sufficiently small compared with the output resistors RNB0 and RPB0 of the bias circuit 7 and if CNU=CND=CAC or CPU=CPD=CAC, the rising time and falling time TAC of the pulse waveform S1NB of the bias voltage NBIAS and the pulse waveform S1PB of the bias voltage PBIAS are given by the same equation as equation (36), $$\tau AC \approx CAC \times RBFO.$$

On the other hand, the voltage change ΔV1NAC of the pulse S1NB transmitted via the capacitors and the voltage change ΔV1PAC of the pulse waveform S1NB can be expressed by the following equations using the output amplitude VB0 of the phase comparator 1:

$$\Delta V1NAC = \{CAC/(CNB+2CAC)\} \times VBO \quad (40)$$

$$|\Delta V1PAC| = \{CAC/(CPB+2CAC)\} \times VBO \quad (41)$$

The waveform ΔVtailN of the portion of pulse waveform S1NB remaining after the output pulse of the phase comparator 1 is over minus the tail can be approximated by the following equation:

$$\Delta VtailN(t) \approx (\Delta V1 - \Delta V1NAC) \times \exp(-t/\tau NB) \quad (42)$$

where, τNB=(CNB+2CAC)×RNBO

Further, the waveform ΔVtailP of the portion of the pulse waveform S1PB remaining after the output pulse of the phase comparator 1 is over minus the tail can be approximated by the following equation:

$$|\Delta VtailP(t)| \approx (\Delta V1 - |\Delta V1PAC|) \times \exp(-t/\tau PB) \quad (43)$$

Here, since the blunting of the waveform of the bias voltage NBIAS also influences the bias voltage PBIAS, the time constant τPB of equation (43) can be expressed by the following equation:

$$\tau PB \approx k \times (CPB + 2CAC) \times RPBO \quad (44)$$

where, $k = \sqrt{e} \sim \sqrt{2}$

When the gain of the bias circuit 7 is 1, preferably by designing the circuit so that ΔV1=ΔV1NAC=ΔV1PAC under standard conditions or worst conditions, even in the output of the bias circuit 7, it is possible to reduce the voltage change of the pulse waveform of the trailing edge of the reference clock signal φREF.

Third Embodiment

Figure 5:
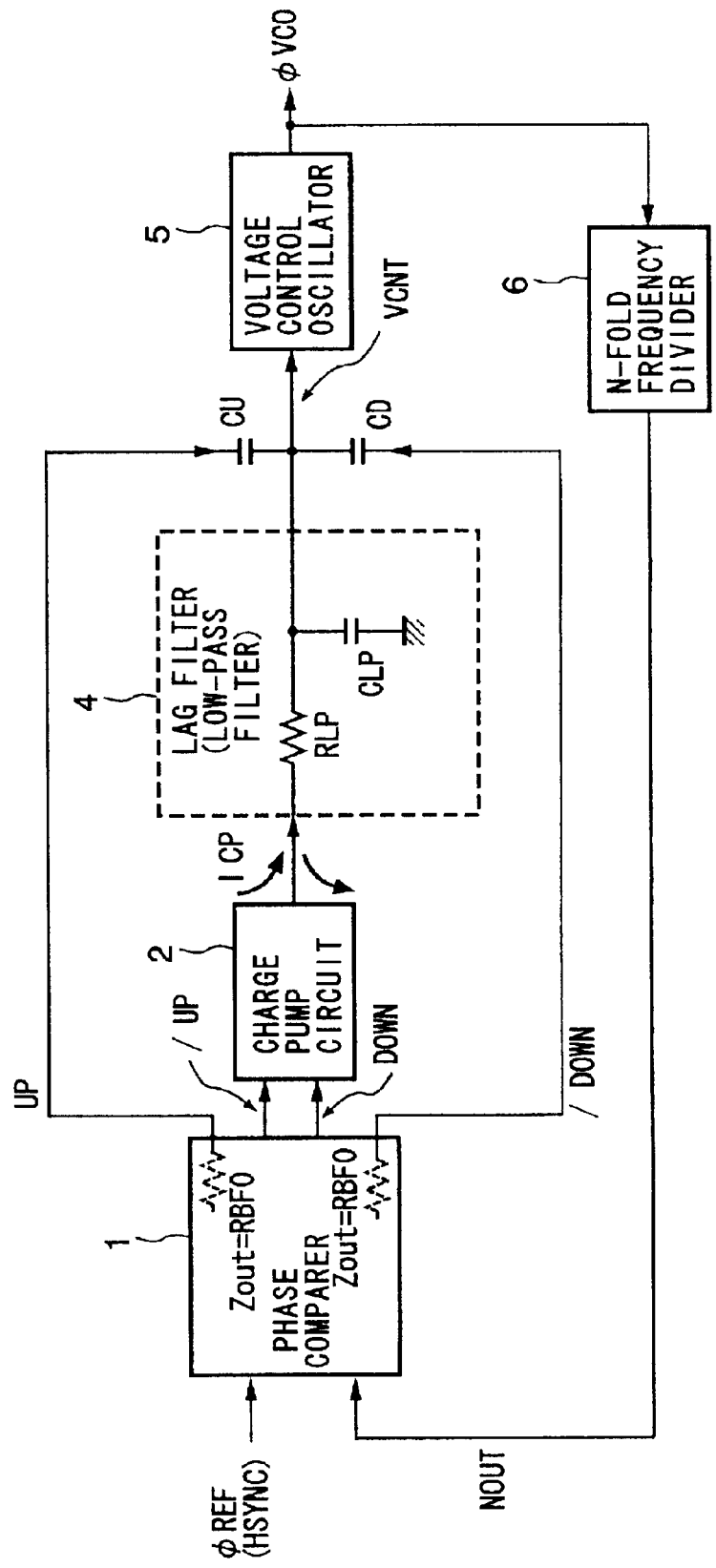
FIG. 5 is a view of the configuration of a third embodiment of a PLL circuit according to the present invention.

FIG. 5 is a view of the configuration of a third embodiment of a PLL circuit according to the present invention.

The PLL circuit shown in FIG. 5 includes a phase comparator 1, a charge pump circuit 2, a lag filter 4, a voltage-controlled oscillator 5, a frequency divider 6, a capacitor CU, and a capacitor CD.

The same reference numerals in FIG. 5 and FIG. 1 refer to the same constituent elements.

The point of difference of the first embodiment of the present invention shown in FIG. 1 and the third embodiment of the present invention shown in FIG. 5 lies in the fact that the lag-lead filter 3 which had been inserted between the low-pass filter 4 and the charge pump 2 in the PLL circuit in FIG. 1 is deleted from the PLL circuit in FIG. 5.

In the PLL circuit in FIG. 5, a capacitor CU and a capacitor CD are provided at the output of the lag filter (low-pass filter) 4, and the outputs of the phase comparator 1, that is, the up signal UP and down signal /DOWN, are transmitted according to the voltage-division ratio of the capacitances with the capacitor CLP. Due to this, the lag filter 4 generates the output voltage VCNT having a rectangular waveform and operates in the same way as a lag-lead filter. In the present embodiment, almost no waveform is left after removing the tail after the output pulse of the phase comparator 1 is over. Further, in the same way as the lag-lead filter of a dual-charge-pump circuit type (see IEEE 1993, CUSTOM INTEGRATED CIRCUITS CONFERENCE 10.2.1, FIG. 13), since the voltage change of a pulse waveform and the voltage change due to charging and discharging can be designed independently, it is easy to design a PLL circuit for a reference clock signal φREF of a wide frequency band.

In addition, because the voltage change of the pulse waveform input to the voltage-controlled oscillator 5 can be expressed by equation (37), the variability can be made smaller compared with the system of generating a rectangular pulse waveform by the flow of the current ICP through the resistor RF1 of the lag-lead filter 3 in the PLL circuit in FIG. 1.

However, since it is conceivable that CU=CD= CAC:CLP≈1:20 or so, application would be difficult unless the lag filter 4 is included in the semiconductor chip.

Fourth Embodiment

Figure 6:
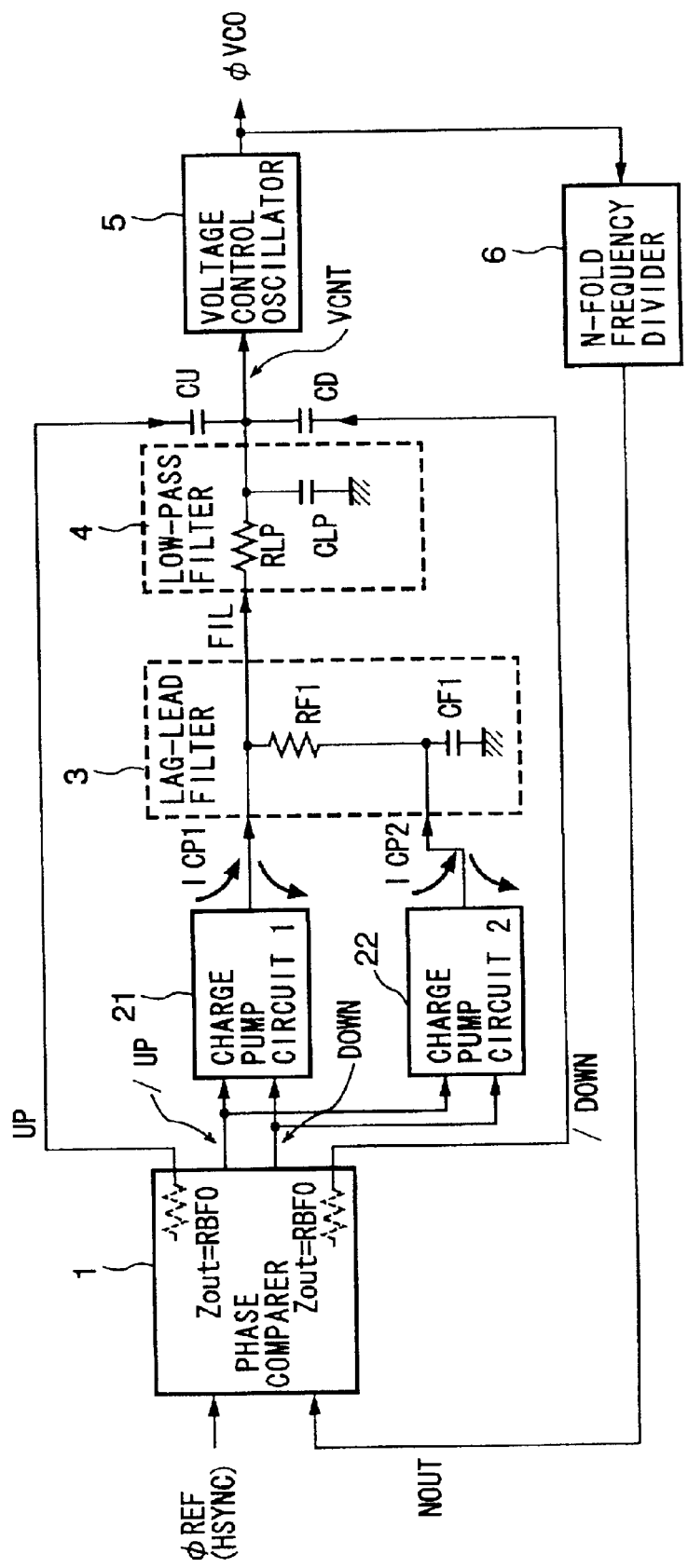
FIG. 6 is a view of the configuration of a fourth embodiment of a PLL circuit according to the present invention.

FIG. 6 is a view of the configuration of a fourth embodiment of a PLL circuit according to the present invention.

The PLL circuit shown in FIG. 6 includes a phase comparator 1, a charge pump circuit 21, a charge pump circuit 22, a lag-lead filter 3, a low-pass filter 4, a voltage-controlled oscillator 5, a frequency divider 6, a capacitor CU, and a capacitor CD.

The same reference numerals in FIG. 6 and FIG. 1 refer to the same constituent elements.

The point of difference of the first embodiment of the present invention shown in FIG. 1 and the fourth embodiment of the present invention shown in FIG. 6 lies in the fact that in the example of the invention in FIG. 6, there are provided two charge pump circuits for use of a so-called dual charge pump circuit system. Needless to say that even with a dual charge pump circuit system, the same effects as the first embodiment of the present invention can be obtained. That is, the voltage change at the output of the low-pass filter 4 after the trailing edge of the reference clock signal φREF can be made smaller.

When a dual charge pump circuit system is adopted, it is easy to design a PLL circuit for a reference clock signal φREF of a wide frequency band.

Fifth Embodiment

Figure 7:
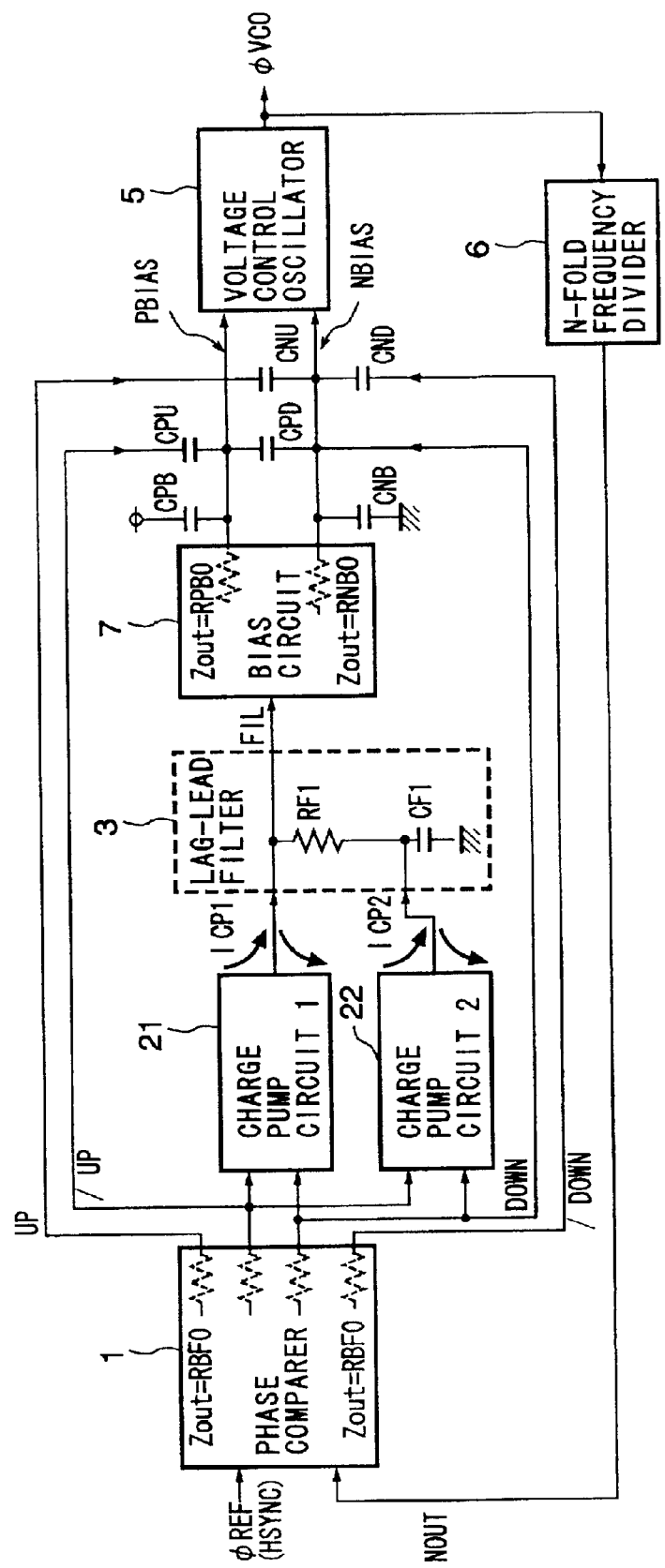
FIG. 7 is a view of the configuration of a fifth embodiment of a PLL circuit according to the present invention.

FIG. 7 is a view of the configuration of a fifth embodiment of a PLL circuit according to the present invention.

The PLL circuit shown in FIG. 7 includes a phase comparator 1, a charge pump circuit 21, a charge pump circuit 22, a lag-lead filter 3, a bias circuit 7, a voltage-controlled oscillator 5, a frequency divider 6, a capacitor CPB, a capacitor CNB, a capacitor CPU, a capacitor CPD, a capacitor CNU, and a capacitor CND.

The same reference numerals in FIG. 7 and FIG. 3 refer to the same constituent elements.

The point of difference of second embodiment of the present invention shown in FIG. 3 and the fifth embodiment of the present invention shown in FIG. 7 lies in the fact that in the example of the invention of FIG. 7, two charge pump circuits are provided for a so-called dual charge pump circuit system. Needless to say that even with a dual charge pump circuit system, the same effects as the second embodiment of the present invention can be obtained. That is, the voltage change at the output of the bias circuit 7 after the trailing edge of the reference clock signal φREF can be made smaller.

When a dual charge pump circuit system is adopted, it is easy to design a PLL circuit for a reference clock signal φREF of a wide frequency band.

Sixth Embodiment

Figure 8:
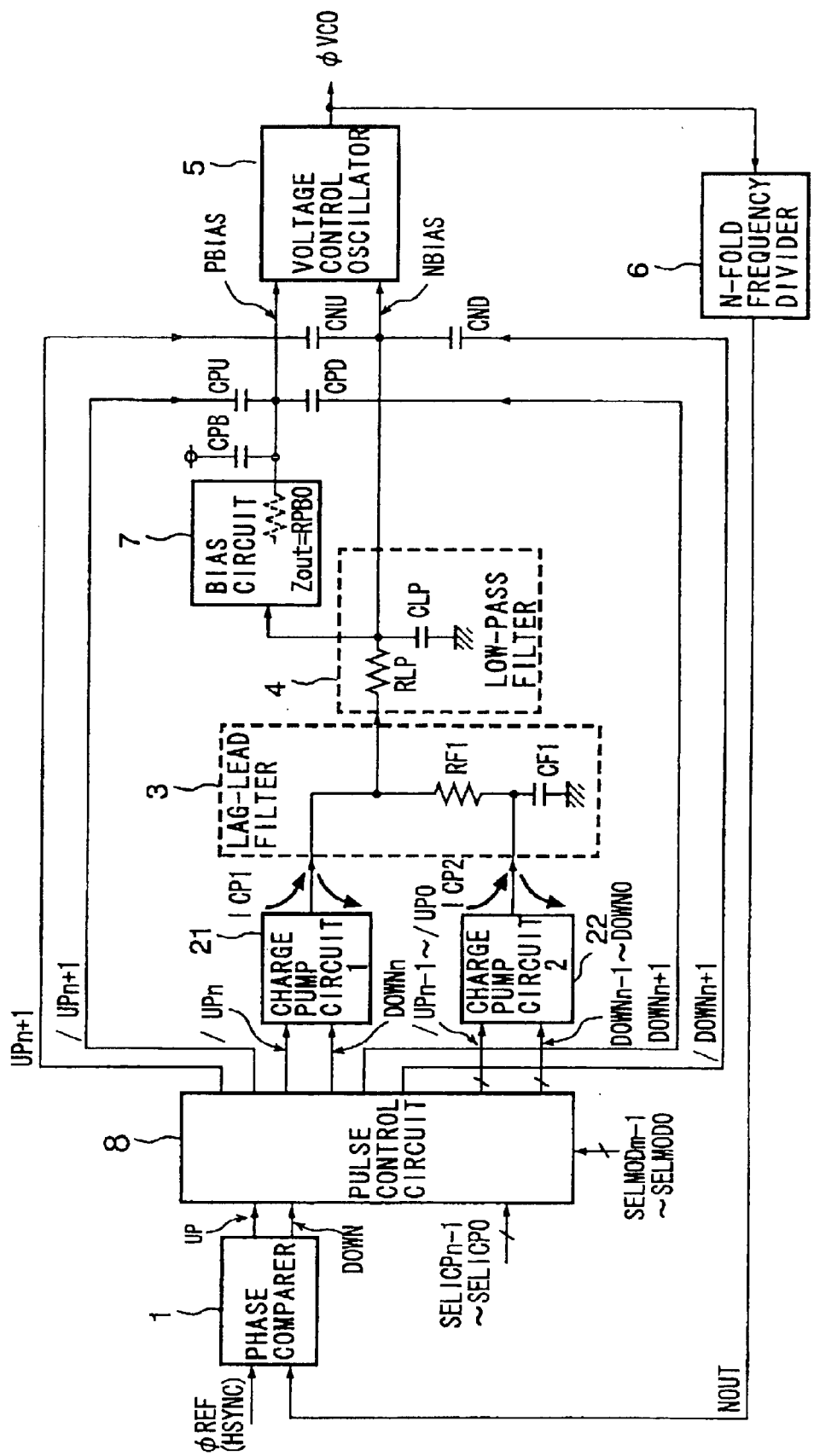
FIG. 8 is a view of the configuration of a sixth embodiment of a PLL circuit according to the present invention.

FIG. 8 is a view of the configuration of a sixth embodiment of a PLL circuit according to the present invention.

The PLL circuit shown in FIG. 8 includes a phase comparator 1, a pulse control circuit 8, a charge pump circuit 21, a charge pump circuit 22, a lag-lead filter 3, a low-pass filter 4, a bias circuit 7, a voltage-controlled oscillator 5, a frequency divider 6, a capacitor CPB, a capacitor CNB, a capacitor CPU, a capacitor CPD, a capacitor CNU, and a capacitor CND.

The same reference numerals in FIG. 8 and FIG. 7 refer to the same constituent elements.

The points of difference of the sixth embodiment of the present invention shown in FIG. 8 and the fifth embodiment of the present invention shown in FIG. 7 lie in the fact that in the present embodiment shown in FIG. 7, a pulse control circuit 2 is provided between the phase comparator 1 and the charge pump circuits and the magnitude of the output current ICP2 of the charge pump 22 is variable according to the current selection signals SELICPn−1 to SELICP0 and in the fact that a low-pass filter 4 is provided between the lag-lead filter 3 and the bias circuit 7 and ab ias signal can be obtained from the output of the low-pass filter 4.

In the sixth embodiment of the present invention, use is made of a dual charge pump circuit system able to handle a reference clock signal φREF of a wide frequency band when made into a semiconductor integrated circuit. The charge pump circuit is comprised of a charge pump circuit 21 for supplying a fixed charge pump output current ICP1 and a charge pump circuit 22 for supplying a variable charge pump output current ICP2.

The lag-lead filter 3 receives the output current ICP1 of the charge pump circuit 21 and the output current ICP2 of the charge pump circuit 22 and outputs to the low-pass filter 4 a voltage having a combined waveform of a rectangular pulse waveform and a flat voltage waveform.

The output current ICP1 of the charge pump circuit 21 flows through the resistor RF1 of the lag-lead filter 3, whereby a rectangular pulse waveform is generated at the output of the lag-lead filter 3. In addition, the capacitor CF1 of the lag-lead filter 2 is charged and discharged by the current ICP1 flowing through the resistor RF1 and the output current ICP2 of the charge pump circuit 22, whereby a rectangular pulse waveform is generated at the output of the lag-lead filter 3.

When the period of the reference clock signal φREF is longer than the horizontal synchronization signal for displaying images, the capacitor CF1 of the lag-lead filter 3 becomes one of a large value, so the capacitor CF1 becomes an external part.

The low-pass filter 4 supplies a voltage reduced in the noise included in the output voltage of the lag-lead filter 3 to the voltage-controlled oscillator 5 and the bias circuit 7 as the bias voltage NBIAS. The low-pass filter 4 preferably is built in the same semiconductor chip as the voltage-controlled oscillator 5 and removes the noise of the control voltage as seen from the voltage-controlled oscillator 5 generated because of the difference of the grounding points of an external capacitor CF1 and the voltage-controlled oscillator 5.

The bias circuit 7 receives the output of the low-pass filter 4, generates a bias voltage PBIAS by inverting the bias voltage NBIAS relative to a reference voltage described by the following equation, and supplies the same to the voltage-controlled oscillator 5. Here, Vthn represents the threshold voltage of an nMOS transistor (for example, the nMOS transistor Qn51 in FIG. 15) that controls the current flowing into the grounding line side in each delay stage of the voltage-controlled oscillator 5, while Vthp represents the threshold voltage of a pMOS transistor (for example, the pMOS transistor Qp50 in FIG. 15) that controls the current flowing into the power line side in each delay stage of the voltage-controlled oscillator 5.

$$VL = \{(Vdd - Vthn - |Vthp|)/2 + Vthn\} \approx Vdd/2 \quad (45)$$

The capacitor CNU and capacitor CND are connected to the output of the low-pass filter 4. The up signal UPn+1 and down signal /DOWNn+1 output by the pulse control circuit 8 are input to these capacitors. Due to this, a pulse waveform determined by the voltage-division ratio of the capacitances of the capacitor CNU and capacitor CND and the capacitor CLP is superposed on the bias voltage NBIAS.

The capacitor CPU and capacitor CPD are connected to the output of the bias circuit 7. The up signal /UPn+1 and the down signal DOWNn+1 output by the pulse control circuit 8 are input to these capacitors. Due to this, a pulse waveform determined by the voltage-division ratio of the capacitances of the capacitor CPU and capacitor CPD and the capacitor CPB is superposed on the bias voltage PBIAS.

The pulse control circuit 2 receives the up signal UP and the down signal DOWN of the phase comparator 1 and supplies the up signal /Upn and the down signal DOWNn to the charge pump circuit 21.

In addition, the pulse control circuit 8 sets the current selection signals SELICPn−1 to SELICP0 according to the frequency of the reference clock signal φREF and uses these to supply various combinations of the up signal /UPn−1 to up signal /UP0 and down signal DOWNn−1 to down signal DOWN0 to the charge pump circuit 22. As a result, the magnitude of the current ICP2 output from the charge pump circuit 22 can be changed.

For example, when noise of a frequency lower than the frequency of the reference clock signal φREF is sufficiently small, by making the value of the output current ICP2 of the charge pump circuit 22 small after the PLL circuit is locked, the frequency jitter after locking can be made small.

In addition, the pulse control circuit 8 receives the up signal UP and the down signal DOWN of the phase comparator 1, supplies the up signal UPn+1 and down signal /DOWNn+1 to the capacitor CNU and capacitor CND connected to the output of the low-pass filter 4, and supplies the up signal /UPn+1 and down signal DOWNn+1 to the capacitor CPU and capacitor CPD connected to the output of the bias circuit 7.

In addition, according to the mode selection signal SEIMODm−1 to the mode selection signal SEIMOD0, the pulse control circuit 8 activates or deactivates the outputs of the up signal UPn+1, up signal /UPn+1, down signal DOWNn+1, and down signal /DOWNn+1 that drive the capacitors.

For example, when the PLL circuit is used for applications of displaying images, text, etc., the outputs of the up signal UPn+1, up signal /UPn+1, down signal DOWNn+1, and down signal /DOWNn+1 that drive the capacitors are activated by the mode selection signals. Due to this, the voltage change of the pulse waveforms of the bias voltage NBIAS and the bias voltage PBIAS at the trailing edge of the reference clock signal φREF can be reduced.

Further, when using the PLL circuit for a sampling clock for reproducing recorded data, because the pulse waveform input to the voltage-controlled oscillator 5 must not be blunted, the outputs of the signals driving the capacitors are deactivated by the mode selection signals.

That is, according to the sixth embodiment of the present invention, by changing settings using the mode selection signals, the PLL circuit can be used for a variety of applications.

In addition, the pulse control circuit 8 receives the up signal UP and the down signal DOWN of the phase comparator 1 and adjusts the pulse widths for example according to the way of blunting of the drive signals of the charge pump circuit or the drive signals of the capacitors preferably so that the insensitive band becomes zero at the output of the charge pump circuit.

In addition, the pulse control circuit 8 lengthens or shortens pulse widths of for example the up signal UPn+1, up signal /UPn+1, down signal DOWNn+1, and down signal /DOWNn+1 driving the capacitors or the pulse widths of the up signal /UPn and down signal DOWNn driving the charge pump circuit 21, that is, just the pulse widths of the rectangular bias signals input to the voltage-controlled oscillator 5, according to the mode selection signal SELMODm−1 to the mode selection signal SELMOD0. Due to this, the correction of the phase jitter after locking can be made more powerful.

In addition, according to the mode selection signal SELMODm−1 to the mode selection signal SELMOD0, when an LSI including a PLL circuit is in the standby mode, the pulse control circuit 8 forces output of a voltage to block a penetration current in the bias circuit 7 or the voltage-controlled oscillator 5 to the output of the charge pump circuits 21 and 22. Alternatively, it forces the output impedance to be high (to try to avoid adding a switching element for blocking a penetration current in the bias circuit 7 and the voltage-controlled oscillator 5). Providing such a function contributes to reducing the power consumption of a system on standby.

In addition, according to the mode selection signal SEIMODm−1 to the mode selection signal SELMOD0, for example, when testing an LSI including a PLL circuit, the pulse control circuit 8 forces the flow of a charge pump output current at the time of UP or DOWN operation or supplies a voltage from the outside to make the output impedance high to enable the test of the voltage-controlled oscillator 5.

Providing such a test function makes it easy to test the characteristic of the output current vs. voltage of the charge pump circuit and the characteristic of the oscillation frequency vs. control voltage of the voltage-controlled oscillator 5.

Seventh Embodiment

Figure 9:
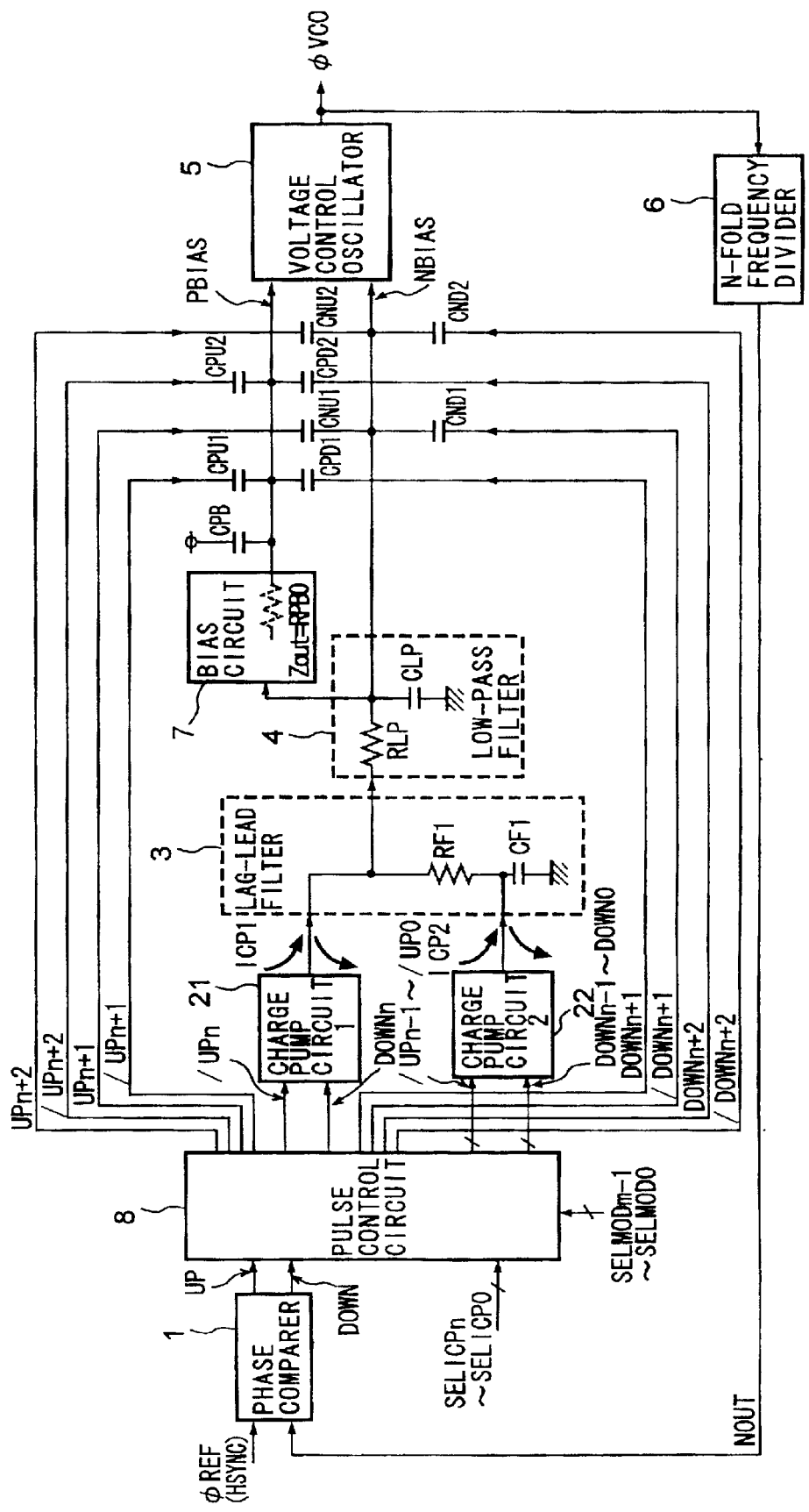
FIG. 9 is a view of the configuration of a seventh embodiment of a PLL circuit according to the present invention.

FIG. 9 is a view of the configuration of a seventh embodiment of a PLL circuit according to the present invention.

The PLL circuit shown in FIG. 9 includes a phase comparator 1, a pulse control circuit 8, a charge pump circuit 21, a charge pump circuit 22, a lag-lead filter 3, a low-pass filter 4, a bias circuit 7, a voltage-controlled oscillator 5, a frequency divider 6, a capacitor CPB, a capacitor CPU1, a capacitor CPD1, a capacitor CPU2, a capacitor CPD2, a capacitor CNU1, a capacitor CND1, a capacitor CNU2, and a capacitor CND2.

The same reference numerals in FIG. 9 and FIG. 8 refer to the same constituent elements.

The points of difference of the sixth embodiment of the present invention shown in FIG. 8 and the seventh embodiment of the present invention shown in FIG. 9 lie in the fact that in the seventh embodiment, the number of capacitors superposing pulses on the bias voltage NBIAS and the bias voltage PBIAS is increased and in the fact that the number of the current selection signals SELICPn is increased.

The capacitor CPU1, capacitor CPD1, capacitor CPU2, and capacitor CPD2 are connected to the output of the bias circuit 7. The up signal /UPn+1, up signal /UPn+2 signal, down signal DOWNn+1, and down signal DOWNn+2 signals output by the pulse control circuit 8 are input to these capacitors, respectively. In addition, a capacitor CPB for stabilizing the bias voltage PBIAS is connected with the power line.

The capacitor CNU1, capacitor CND1, capacitor CNU2, and capacitor CND2 are connected to the output of the low-pass filter 4. The up signal UPn+1, up signal UPn+2, down signal /DOWNn+1, and down signal /DOWNn+2 output by the pulse control circuit 8 are input to these capacitors, respectively.

In addition, according to the mode selection signal SELMODn, the pulse control circuit 8 controls the output current ICP1 of the charge pump circuit 21 and the voltage change ΔV1AC of a pulse waveform generated by the voltage-division ratio of the capacitances.

For example, when SELICPn is a low level, a small current ICP1S is output as the output current ICP1. In addition, only the up signal UPn+1, up signal /UPn+1, down signal DOWNn+1, and down/DOWNn+1 are activated, and a small pulse voltage ΔV1ACS is generated.

Conversely, when SELICPn is a high level, a large current ICP1L compared with the output current ICP1S is output. In addition to the up signal UPn+1, up signal /UPn+1, down signal DOWNn+1, and down signal /DOWNn+1, the up signal UPn+2, up signal /UPn+2, down signal DOWNn+2, and down signal /DOWNn+2 are activated, so a large pulse voltage ΔV1ACL is generated.

For example, if

CLP=CPB=C1, CNU1=CND1=CPU1=CPD1=CAC1

CNU2=CND2=CPU2=CPD2=CAC2 and the amplitude of the pulse driving the capacitors is Vdd, preferably the circuit is designed so that the following equations hold:

$$ICP1S \times RF1 \approx \{CAC1/(C1+2CAC1+2CAC2)\} \times Vdd \quad (46)$$

$$ICP1L \times RF1 \approx \{(CAC1+CAC2)/(C1+2CAC1+2CAC2)\} \times Vdd \quad (47)$$

By designing the circuit to meet with the above equations, even when the voltages of the pulse waveforms input to the voltage-controlled oscillator 5 are different, the voltage change of the pulse waveforms after the trailing edge of the reference clock signal φREF can be made small.

In addition, Japanese Unexamined Patent Publication (Kokai) No. 10-242851 and Japanese Unexamined Patent Publication (Kokai) No. 11-195982 disclose PLL circuits in which when a phase difference becomes small, the feedback of the loop automatically becomes small. In the present embodiment, however, for example, by setting the pulse widths of the up signal UPn+1, up signal /UPn+1, down signal DOWNn+1, and down signal /DOWNn+1 and the pulse widths of the up signal UPn+2, up signal /UPn+2, down signal DOWNn+2, and down signal /DOWNn+2 to different pulse widths by the pulse control circuit 8 or by setting the pulse widths of the up signal /UPn and down signal DOWNn and the pulse widths of the up signal /UPn−1 to up signal /UP0 and down signal DOWNn−1 to down signal DOWN0 signals to different pulse widths by the pulse control circuit 8, it is possible to realize a PLL circuit or a DLL circuit able to automatically switch the amount of phase pull-in not accompanied with frequency change on a screen due to a pulse waveform S1 and the amount of the phase pull-in accompanied with frequency change on a screen due to a pulse waveform S2 for example by independent phase differences.

In the above, a detailed explanation was given of the present invention taking as an example a PLL circuit, but needless to say the invention may also be applied to other circuits using a lag-lead filter, for example, a DLL circuit.

In addition, needless to say, the invention can be applied to PLL circuits or DLL circuits not introduced as embodiments of the present invention comprising feedback loops having a plurality of branches using a plurality of phase comparators, charge pump circuits, filters, bias circuits, or circuits having branches in these circuits.

Examples of Application of Present Invention

Figure 10:
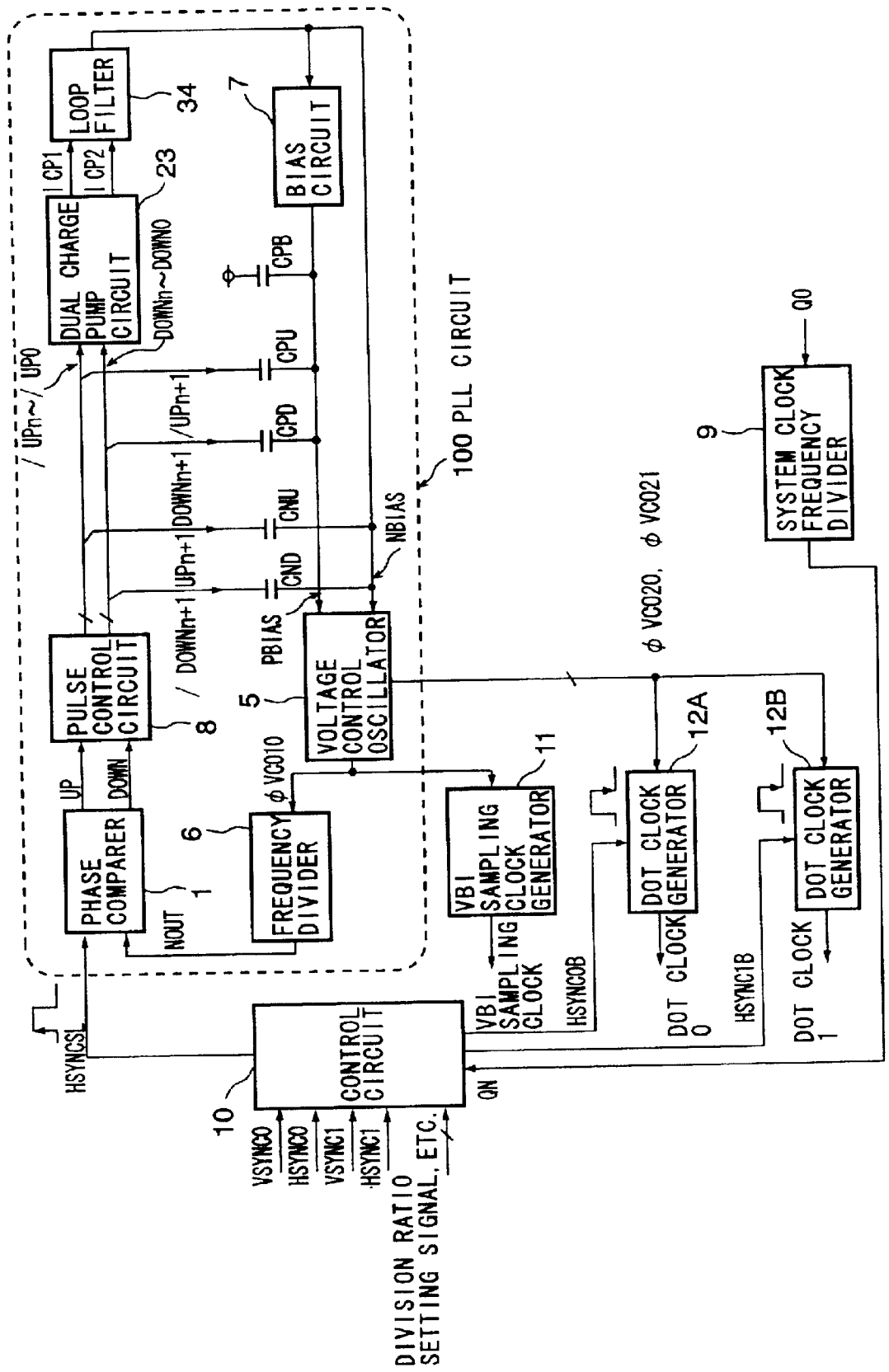
FIG. 10 is a view of the configuration of a dot clock generating circuit and a VBI sampling clock generating circuit for use in digital TV to which the PLL circuit of the present invention is applied.

FIG. 10 is a view of the configuration of a dot clock generating circuit and VBI sampling clock generating circuit for use in digital TV to which the PLL circuit of the present invention is applied.

The dot clock generating circuit and VBI sampling clock generating circuit shown in FIG. 10 include a control circuit 10, a VBI sampling clock generator 11, a dot clock generator 12A, a dot clock generator 12B, a system clock frequency divider 9, and a PLL circuit 100.

The PLL circuit 100, for example, is the PLL circuit shown in FIG. 8. It receives a reference clock signal HSCSL from the control circuit 10, outputs a clock signal φVCO 10 synchronized with it to the VBI sampling clock generator 11, and outputs a clock signal VCO20 and clock signal VCO21 to the dot clock generator 12A and dot clock generator 12B.

The control circuit 10 selects a reference clock signal HSYNCSL of the PLL circuit from the two horizontal synchronization signal HSYNC0 and horizontal synchronization signal HSYNC1 and an output clock signal QN of the system clock frequency divider 9 and outputs the same to the phase comparator 1. In addition, according to the frequency of the reference clock signal HSYNCSL, the division factor of the frequency divider 6 and the output current of the charge pump circuit 23 are set to optimal values. A change from the old settings to the new settings is made in synchronization with the horizontal synchronization signal HSYNC0, horizontal synchronization signal HSYNC1, vertical synchronization signal VSYNC0, and vertical synchronization signal VSYNC1.

For example, if a horizontal synchronization signal is selected as the reference clock signal, the up signal UPn+1, down signal /DOWNn+1, up signal /UPn+1, and down signal DOWNn+1 superposing pulse signals onto the bias voltage NBIAS and bias voltage PBIAS are activated. Due to this, in the bias voltage NBIAS and bias voltage PBIAS, blunting-free sharp pulse waveforms synchronized with the rising edge of the reference clock signal HSNCSL are generated, and frequency variation after the trailing edge of the reference clock signal HSNCSL is suppressed.

In addition, for example, on a screen of a computer, when the frequency-divided system clock signal is selected as the reference clock signal, the up signal UPn+1, down signal /DOWNn+1, up signal /UPn+1, and down signal DOWNn+1 are deactivated. Due to this, at the rising edge of the reference clock signal HSNCSL, a strongly blunted pulse waveform is generated to prevent the appearance of a region in which the width of the dot clock changes at a slant on the screen.

When generating VBI sampling clocks in broadcasting TV subtitles, a clock signal φVCO10 having a frequency of (frequency of VBI data)×(number of samplings)×NVBI is generated in the voltage-controlled oscillator 5 using the horizontal synchronization signal as a reference clock signal. The clock signal φVCO10 is divided by NVBI in the VBI sampling clock generator 11 to obtain the VBI sampling clock.

The dot clock generators 12A and 12B generate independent dot clocks for handling the main picture and sub picture. They receive two output signals φVCO20 and φVCO21 of different phases from the voltage-controlled oscillator 5 and select from the four clock signals, including their inverted signals, the clock signals which rise fastest after the trailing edge of the buffer output HSYNC0B or HSYNC1B of the horizontal synchronization signals. The selected clock signals are divided to give a suitable width of letters, and a dot clock 0 or dot clock 1 is generated.

By using the PLL circuit of the present invention, jitter of the clock signals supplied to the VBI sampling clock generator 11 and the dot clock generators 12A and 12B is reduced, so a picture can be obtained in which flicker or waving is not visible.

According to the present invention, even when a low-pass filter is included in a loop filter for reducing noise or when a capacitor is provided for stabilizing a control voltage in a control voltage line of a voltage-controlled oscillator, a control voltage having a blunt-free sharp pulse waveform is input to the voltage-controlled oscillator in the phase pull-in operation performed in each cycle of a reference clock signal and, after the phase pull-in operation, the control voltage can be stabilized within a short time. Namely, the frequency change after the phase pull-in operation performed in each cycle of the reference clock signal can be reduced.

In addition, in the phase pull-in operation performed in each cycle of the reference clock signal, it is possible to freely select either to generate a control voltage having a blunt-free sharp pulse waveform or to generate a strongly blunted control voltage. Therefore, it is possible to select suitable settings according to the frequency or the duty of the reference clock signal, the method of using the circuits, or the noise level, so the PLL circuit can be used in a variety of applications.

Note that the present invention is not limited to the above embodiments and includes modifications within the scope of the claims.

What is claimed is:

1. A phase-locked loop circuit comprising:

a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase;

a smoothing means for smoothing the leading phase signal or the delayed phase signal output from the phase comparison means and outputting the result as a control signal;

a superposing means for superposing the leading phase signal or the delayed phase signal output from the phase comparison means on the control signal; and an oscillation circuit for receiving the control signal superposed with other signals by the superposing means and outputting the feedback signal of a frequency corresponding to the control signal to the phase comparison means.

2. A phase-locked loop circuit as set forth in claim 1, wherein the superposing means includes a capacitor receiving the leading phase signal or the delayed phase signal at one terminal and connected to an output line of the control signal of the smoothing means at another terminal.

3. A phase-locked loop circuit as set forth in claim 2, wherein the smoothing means includes a current outputting means for outputting a current corresponding to the leading phase signal or a current corresponding to the delayed phase signal and a filter for outputting said control signal obtained by smoothing the output current from the current outputting means.

4. A phase-locked loop circuit as set forth in claim 2, wherein the smoothing means includes a current outputting means for outputting a current corresponding to the leading phase signal or a current corresponding to the delayed phase signal, a series circuit having a resistor and a capacitor receiving the output current from the current outputting means, and a noise filter for receiving the voltage of the series circuit and outputting said control signal after removing noise components included in the voltage.

5. A phase-locked loop circuit as set forth in claim 4, wherein the current outputting means adjusts an amplitude of the output current according to a current adjusting signal.

6. A phase-locked loop circuit as set forth in claim 2, wherein the smoothing means includes a first current outputting means and a second current outputting means for outputting a current corresponding to the leading phase signal or a current corresponding to the delayed phase signal, a series circuit having a resistor receiving the output current from the first current outputting means and a capacitor receiving a current of the resistor and the output current from the second current outputting means, and a noise filter for receiving the voltage of the series circuit and outputting said control signal after removing noise components included in the voltage.

7. A phase-locked loop circuit as set forth in claim 6, wherein
the first current outputting means adjusts an amplitude of the output current according to a current adjusting signal.

8. A phase-locked loop circuit as set forth in claim 6, wherein the second current outputting means adjusts an amplitude of the output current according to a current adjusting signal.

9. A phase-locked loop circuit as set forth in claim 1, wherein
the phase comparison means activates or deactivates outputs of the leading phase signal and the delayed phase signal to the superposing means according to a mode selecting signal.

10. A phase-locked loop circuit as set forth in claim 1, wherein
the phase comparison means adjusts pulse amplitudes of the leading phase signal and the delayed phase signal according to a pulse amplitude adjusting signal.

11. A phase-locked loop circuit as set forth in claim 1, wherein
the phase comparison means selects at least one leading phase signal or delayed phase signal from a plurality of the leading phase signals or the delayed phase signals according to a pulse amplitude adjusting signal and outputs it to the superposing means, and
the superposing means includes at least one capacitor receiving the leading phase signal or the delayed phase signal at one terminal and connected to an the current outputting means adjusts an amplitude of the output current according to a current adjusting signal.

12. A phase-locked loop circuit as set forth in claim 1, wherein
the phase comparison means adjusts pulse widths of the leading phase signal and the delayed phase signal according to a pulse width adjusting signal.

13. A phase-locked loop circuit comprising a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase,
a smoothing means for smoothing the leading phase signal or the delayed phase signal output from the phase comparison means and outputting the result as a control signal,
a bias signal generating means for outputting a first bias signal and a second bias signal corresponding to the control signal,
a noise filter for removing noise components included in the first bias signal and the second signal,
a first superposing means for superposing the leading phase signal or the delayed phase signal output from the phase comparison means on the first bias signal,
a second superposing means for superposing the leading phase signal or the delayed phase signal output from the phase comparison means on the second bias signal, and
an oscillation circuit which includes a plurality of delay stages for exchanging and outputting a first current variable according to the first bias signal superposed with other signals by the first superposing means and a second current variable according to the second bias signal superposed with other signals by the second superposing means according to levels of input signals, feeds back an output signal of a last delay stage to an input of a first delay stage, and outputs an output signal of one of the delay stages as the feedback signal to the phase comparison means.

14. A phase-locked loop circuit as set forth in claim 13, wherein
the first superposing means includes a capacitor receiving the leading phase signal or the delayed phase signal at one terminal and connected to an output line of the first bias signal of the bias signal generating means at another terminal, and
the second superposing means includes a capacitor receiving the leading phase signal or the delayed phase signal at one terminal and connected to an output line of the second bias signal of the bias signal generating means at another terminal.

15. A phase-locked loop circuit as set forth in claim 13, wherein
the smoothing means includes
a current outputting means for outputting a current corresponding to the leading phase signal or a current corresponding to the delayed phase signal and
a series circuit having a resistor and a capacitor receiving the output current from the current outputting means, and
the bias signal generating means generates the first bias signal and the second bias signal according to a voltage of the series circuit.

16. A phase-locked loop circuit as set forth in claim 15, wherein
the current outputting means adjusts an amplitude of the output current according to a current adjusting signal.

17. A phase-locked loop circuit as set forth in claim 13, wherein
the smoothing means includes
a first current outputting means and a second current outputting means for outputting a current corresponding to the leading phase signal or a current corresponding to the delayed phase signal and
a series circuit having a resistor receiving the output current from the first current outputting means and a capacitor receiving a current of the resistor and the output current from the second current outputting means, and
the bias signal generating means generates the first bias signal and the second bias signal according to a voltage of the series circuit.

18. A phase-locked loop circuit as set forth in claim 17, wherein the first current outputting means adjusts an amplitude of the output current according to a current adjusting signal.

19. A phase-locked loop circuit as set forth in claim 17, wherein the second current outputting means adjusts an amplitude of the output current according to a current adjusting signal.

20. A phase-locked loop circuit as set forth in claim 13, wherein the phase comparison means activates or deactivates outputs of the leading phase signal and the delayed phase signal to the superposing means according to a mode selection signal.

21. A phase-locked loop circuit as set forth in claim 13, wherein the phase comparison means adjusts amplitudes of the leading phase signal and the delayed phase signal according to a pulse amplitude adjusting signal.

22. A phase-locked loop circuit as set forth in claim 13, wherein the phase comparison means selects at least one leading phase signal or delayed phase signal from a plurality of the leading phase signals or the delayed phase signals according to a pulse amplitude adjusting signal and outputs it to the first superposing means and the second superposing means, the first superposing means includes at least one capacitor receiving the leading phase signal or the delayed phase signal at one terminal and connected to an output line of the first bias signal of the bias signal generating means at another terminal, and the second superposing means includes at least one capacitor receiving the leading phase signal or the delayed phase signal at one terminal and connected to an output line of the second bias signal of the bias signal generating means at another terminal.

23. A phase-locked loop circuit as set forth in claim 13, wherein the phase comparison means adjusts pulse widths of the leading phase signal and the delayed phase signal according to a pulse width adjusting signal.

24. A delay-locked loop circuit comprising a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase, a smoothing means for smoothing the leading phase signal or the delayed phase signal output from the phase comparison means and outputting the result as a control signal, a superposing means for superposing the leading phase signal or the delayed phase signal output from the phase comparison means on the control signal, and a delay circuit for receiving the control signal superposed with other signals by the superposing means and the reference signal and outputting to the phase comparison means the feedback signal having a delay corresponding to the control signal relative to the reference signal.

25. A delay-locked loop circuit as set forth in claim 24, wherein the superposing means includes a capacitor receiving the leading phase signal or the delayed phase signal at one terminal and connected to an output line of the control signal of the smoothing means at another terminal.

26. A delay-locked loop circuit as set forth in claim 25, wherein the smoothing means includes a current outputting means for outputting a current corresponding to the leading phase signal or a current corresponding to the delayed phase signal and a filter for outputting a control signal obtained by smoothing the output current from the current outputting means.

27. A delay-locked loop circuit as set forth in claim 25, wherein the smoothing means includes a current outputting means for outputting a current corresponding to the leading phase signal or a current corresponding to the delayed phase signal, a series circuit having a resistor and a capacitor receiving the output current from the current outputting means, and a noise filter for receiving the voltage of the series circuit and outputting said control signal after removing noise components included in the voltage.

28. A delay-locked loop circuit as set forth in claim 27, wherein the current outputting means adjusts an amplitude of the output current according to a current adjusting signal.

29. A delay-locked loop circuit as set forth in claim 25, wherein the smoothing means includes a first current outputting means and a second current outputting means for outputting a current corresponding to the leading phase signal or a current corresponding to the delayed phase signal, a series circuit having a resistor receiving the output current from the first current outputting means and a capacitor receiving a current of the resistor and the output current from the second current outputting means, and a noise filter for receiving the voltage of the series circuit and outputting said control signal after removing noise components included in the voltage.

30. A delay-locked loop circuit as set forth in claim 29, wherein the first current outputting means adjusts an amplitude of the output current according to a current adjusting signal.

31. A delay-locked loop circuit as set forth in claim 29, wherein the second current outputting means adjusts an amplitude of the output current according to a current adjusting signal.

32. A delay-locked loop circuit as set forth in claim 24, wherein the phase comparison means activates or deactivates outputs of the leading phase signal and the delayed phase signal to the superposing means according to a mode selection signal.

33. A delay-locked loop circuit as set forth in claim 24, wherein the phase comparison means adjusts pulse amplitudes of the leading phase signal and the delayed phase signal according to a pulse amplitude adjusting signal.

34. A delay-locked loop circuit as set forth in claim 24, wherein the phase comparison means selects at least one leading phase signal or delayed phase signal from a plurality of the leading phase signals or the delayed phase signals according to a pulse amplitude adjusting signal and outputs it to the superposing means, and the superposing means includes at least one capacitor receiving the leading phase signal or the delayed phase signal at one terminal and connected to an output line of the control signal of the smoothing means at another terminal.

35. A delay-locked loop circuit as set forth in claim 24, wherein the phase comparison means adjusts pulse widths of the leading phase signal and the delayed phase signal according to a pulse width adjusting signal.

36. A delay-locked loop circuit comprising a phase comparison means for detecting a size of a leading phase or a delayed phase of a feedback signal with respect to a reference signal and outputting a leading phase signal having a pulse width corresponding to the size of the leading phase or a delayed phase signal having a pulse width corresponding to the size of the delayed phase, a smoothing means for smoothing the leading phase signal or the delayed phase signal output from the phase comparison means and outputting the result as a control signal, a bias signal generating means for outputting a first bias signal and a second bias signal corresponding to the control signal, a noise filter for removing noise components included in the first bias signal and the second signal, a first superposing means for superposing the leading phase signal or the delayed phase signal output from the phase comparison means on the first bias signal, a second superposing means for superposing the leading phase signal or the delayed phase signal output from the phase comparison means on the second bias signal, and a delay circuit which includes a plurality of delay stages for exchanging and outputting a first current variable according to the first bias signal superposed with other signals by the first superposing means and a second current variable according to the second bias signal superposed with other signals by the second superposing means according to levels of input signals, inputs the reference signal to a first delay, and outputs an output signal of one of the delay stages as the feedback signal to the phase comparison means.

37. A delay-locked loop circuit as set forth in claim 36, wherein the first superposing means includes a capacitor receiving the leading phase signal or the delayed phase signal at one terminal and connected to an output line of the first bias signal of the bias signal generating means at another terminal, and the second superposing means includes a capacitor receiving the leading phase signal or the delayed phase signal at one terminal and connected to an output line of the second bias signal of the bias signal generating means at another terminal.

38. A delay-locked loop circuit as set forth in claim 36, wherein the smoothing means includes a current outputting means for outputting a current corresponding to the leading phase signal or a current corresponding to the delayed phase signal, and a series circuit having a resistor and a capacitor receiving the output current from the current outputting means, and the bias signal generating means generates the first bias signal and the second bias signal according to a voltage of the series circuit.

39. A delay-locked loop circuit as set forth in claim 38, wherein the current outputting means adjusts an amplitude of the output current according to a current adjusting signal.

40. A delay-locked loop circuit as set forth in claim 36, wherein the smoothing means includes a first current outputting means and a second current outputting means for outputting a current corresponding to the leading phase signal or a current corresponding to the delayed phase signal and a series circuit having a resistor receiving the output current from the first current outputting means and a capacitor receiving a current of the resistor and the output current from the second current outputting means, and the bias signal generating means generates the first bias signal and the second bias signal according to a voltage of the series circuit.

41. A delay-locked loop circuit as set forth in claim 40, wherein the first current outputting means adjusts an amplitude of the output current according to a current adjusting signal.

42. A delay-locked loop circuit as set forth in claim 40, wherein the second current outputting means adjusts an amplitude of the output current according to a current adjusting signal.

43. A delay-locked loop circuit as set forth in claim 36, wherein the phase comparison means activates or deactivates outputs of the leading phase signal and the delayed phase signal to the superposing means according to a mode selection signal.

44. A delay-locked loop circuit as set forth in claim 36, wherein the phase comparison means adjusts amplitudes of the leading phase signal and the delayed phase signal according to a pulse amplitude adjusting signal.

45. A delay-locked loop circuit as set forth in claim 36, wherein the phase comparison means selects at least one leading phase signal or delayed phase signal from a plurality of the leading phase signals or the delayed phase signals according to a pulse amplitude adjusting signal and outputs it to the first superposing means and the second superposing means, the first superposing means includes at least one capacitor receiving the leading phase signal or the delayed phase signal at one terminal and connected to an output line of the first bias signal of the bias signal generating means at another terminal, and the second superposing means includes at least one capacitor receiving the leading phase signal or the delayed phase signal at one terminal and connected to an output line of the second bias signal of the bias signal generating means at another terminal.

46. A delay-locked loop circuit as set forth in claim 36, wherein the phase comparison means adjusts pulse widths of the leading phase signal and the delayed phase signal according to a pulse width adjusting signal.

* * * * *

UNITED STATES PATENT AND TRADEMARK OFFICE
CERTIFICATE OF CORRECTION

PATENT NO. : 6,954,511 B2
APPLICATION NO. : 09/955071
DATED : October 11, 2005
INVENTOR(S) : Hiroshi Tachimori et al.

It is certified that error appears in the above-identified patent and that said Letters Patent is hereby corrected as shown below:

Title page item [57]

Abstract:
Line 5, "signa" should read -- signal --.

Column 29:
Line 30, change "an the" to -- the --.

Signed and Sealed this

Thirtieth Day of January, 2007

JON W. DUDAS
*Director of the United States Patent and Trademark Office*